United States Patent
Song et al.

(10) Patent No.: US 11,152,347 B2
(45) Date of Patent: Oct. 19, 2021

(54) CELL CIRCUITS FORMED IN CIRCUIT CELLS EMPLOYING OFFSET GATE CUT AREAS IN A NON-ACTIVE AREA FOR ROUTING TRANSISTOR GATE CROSS-CONNECTIONS

(71) Applicant: QUALCOMM Incorporated, San Diego, CA (US)

(72) Inventors: Stanley Seungchul Song, San Diego, CA (US); Kern Rim, San Diego, CA (US); John Jianhong Zhu, San Diego, CA (US); Da Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 467 days.

(21) Appl. No.: 15/952,638

(22) Filed: Apr. 13, 2018

(65) Prior Publication Data

US 2019/0319022 A1 Oct. 17, 2019

(51) Int. Cl.
*H01L 27/02* (2006.01)
*H01L 23/48* (2006.01)
*H03K 3/3562* (2006.01)
*H01L 27/118* (2006.01)

(52) U.S. Cl.
CPC ........ *H01L 27/0207* (2013.01); *H01L 23/481* (2013.01); *H01L 27/11807* (2013.01); *H03K 3/35625* (2013.01)

(58) Field of Classification Search
CPC .............. H01L 27/0207; H01L 27/092; H01L 27/0921; H01L 27/11807; H01L 21/8238; H01L 21/823821; H01L 21/823871; H01L 21/76895; H03K 3/35625
See application file for complete search history.

(56) References Cited

U.S. PATENT DOCUMENTS

| | | | |
|---|---|---|---|
| 8,274,099 B2 | 9/2012 | Becker | |
| 9,461,143 B2 | 10/2016 | Pethe et al. | |
| 9,583,493 B2 | 2/2017 | Kim et al. | |
| 9,716,106 B2 | 7/2017 | Baek et al. | |
| 9,799,560 B2 | 10/2017 | Song et al. | |
| 2002/0034110 A1* | 3/2002 | Furuya | H01L 27/11807 365/201 |
| 2013/0032885 A1 | 2/2013 | Swamynathan et al. | |

(Continued)

*Primary Examiner* — Khiem D Nguyen
(74) *Attorney, Agent, or Firm* — Qualcomm Incorporated

(57) ABSTRACT

Cell circuits formed in circuit cells employing offset gate cut areas in a non-active area for routing transistor gate cross-connections. In exemplary aspects disclosed herein, to allow cross-connections to be made across different gates between PMOS and NMOS transistors formed in the circuit cell, cut areas in the circuit cell are located in different horizontal routing tracks and offset from each other in the direction of longitudinal axes of gates. Gate cross-connections can be routed around offset gate cut areas and coupled to active gates to form gate cross-connections. In this manner, fewer metal layers may be required to provide such cross-connections in the circuit cell, thus reducing area. Further, gate contacts of cross-connected gates can be formed as gate contacts over active areas (GCOAs) in diffusion areas of the circuit cell, thus facilitating easier routing of interconnections in non-diffusion area of the circuit cell for further ease of routing.

26 Claims, 12 Drawing Sheets

(56) References Cited

U.S. PATENT DOCUMENTS

| | | | |
|---|---|---|---|
| 2013/0207198 A1* | 8/2013 | Becker | H01L 23/5386 |
| | | | 257/369 |
| 2014/0306735 A1 | 10/2014 | Rasouli et al. | |
| 2016/0351490 A1* | 12/2016 | Gupta | H01L 27/0207 |
| 2017/0294429 A1* | 10/2017 | Huang | H01L 23/5226 |
| 2018/0342505 A1* | 11/2018 | Baek | H01L 23/528 |
| 2019/0363167 A1* | 11/2019 | Schultz | H01L 29/66666 |

* cited by examiner

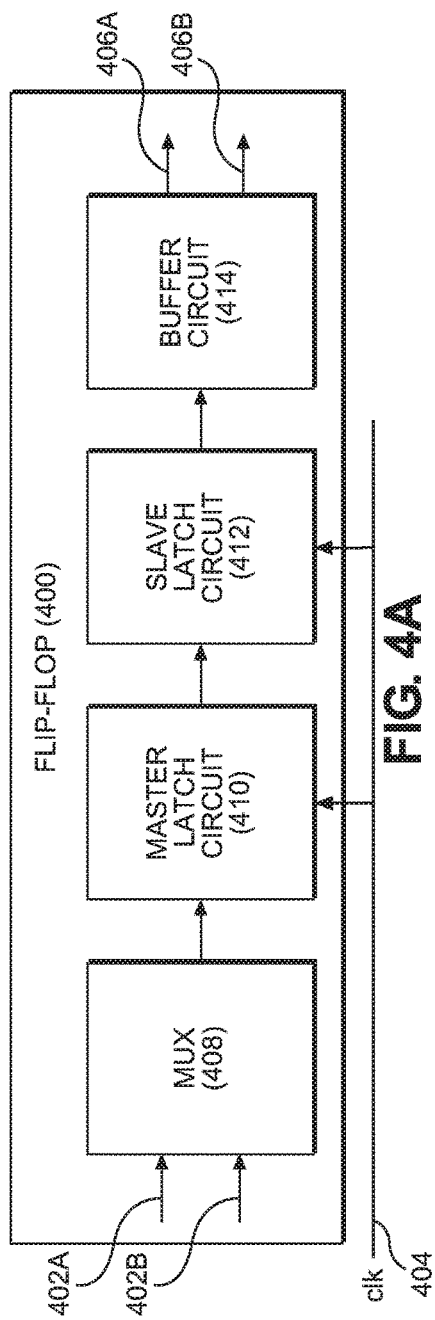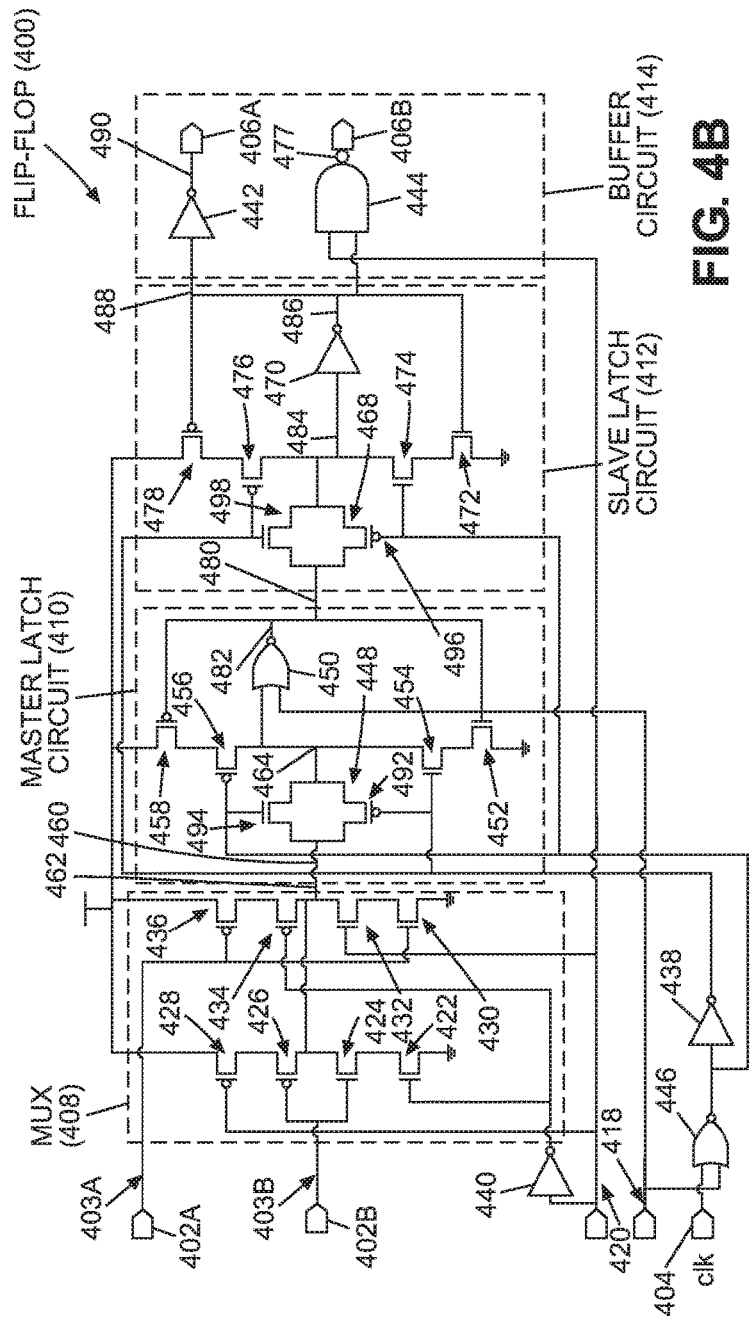

CELL CIRCUITS FORMED IN CIRCUIT CELLS EMPLOYING OFFSET GATE CUT AREAS IN A NON-ACTIVE AREA FOR ROUTING TRANSISTOR GATE CROSS-CONNECTIONS

BACKGROUND

I. Field of the Disclosure

The technology of the disclosure relates generally to circuits, such as flip-flop circuits, and more particularly to cell circuits included in circuit cells that include layout of cross-coupled gate connections between semiconductor devices (e.g., transistors).

II. Background

Semiconductor storage devices are used in integrated circuits (ICs) in electronic devices to provide data storage. One example of a semiconductor storage device is a flip-flop circuit, also known as a "flip-flop." A flip-flop is a basic storage element in sequential logic. Flip-flops and latches are fundamental building blocks of digital electronic systems used in computers, communications, and many other types of systems. A flip-flop is a circuit that has two stable states and can be used to store state information. A flip-flop can be made to change state by signals applied to one or more control inputs, and will also have one or two outputs. For example, FIG. 1A illustrates an exemplary D flip-flop 100. The D flip-flop 100 has two inputs. One input is a control input 102 labeled 'D', and the other input is a clock input 104. The D flip-flop has two outputs: an output 106A labeled 'Q' and a complement output 106B labeled 'Q̄'. As shown from a truth-table 108 in FIG. 1B for the D flip-flop 100 in FIG. 1A, the D flip-flop 100 changes a signal on the output (Q) 106A to follow a signal on the control input 102 in response to the D flip-flop 100 being triggered by a clock signal clk on the clock input 104. An active signal can be applied to the clock input 104 to put the D flip-flop 100 in a transparency mode to act as a simple latch such that a signal on the output 106A (Q), and the complement output 106B (Q̄) immediately changes in response to a change to the signal applied to the control input 102.

Flip-flops like the D flip-flop 100 in FIG. 1A are formed from logic circuits. For example, FIG. 2 is a block diagram of an exemplary flip-flop 200 illustrating exemplary logic circuits provided therein. For example, the flip-flop 200 includes control inputs 202A, 202B, a clock input 204, and an output 206. The flip-flop 200 may include a multiplexer circuit (MUX) 208 that is configured to select between the different control inputs 202A, 202B to couple a signal on such control inputs 202A, 202B to a master latch circuit 210. The master latch circuit 210 stores a logic state of the signal on the selected control input 202A, 202B. The master latch circuit 210 may store an inverted logic state of the signal on the selected control input 202A, 202B and output the stored logic state to a slave latch circuit 212 in response to a clock signal clk on the clock input 204. The slave latch circuit 212 is configured to store an inverted logic state of the logic state stored in the master latch circuit 210 and output the stored logic state to a buffer circuit 214 in response to the clock signal clk on the clock input 204. As shown in FIG. 2, the master latch circuit 210 and the slave latch circuit 212 include a latch circuit that may be like a latch circuit 216 shown therein. As shown in FIG. 2, the latch circuit 216 includes cross-connected transistor circuits 218A, 218B that serve to reinforce a logic state stored by the latch circuit 216 on an output 220.

The flip-flop 200 can be laid out in a standard circuit cell(s) also referred to as a "standard cell" for ease in semiconductor device layout and fabrication. The layout of the flip-flop 200 controls the disposition of materials and metal lines in a semiconductor wafer or die to fabricate the flip-flop 200 in the semiconductor wafer or die. Cross-connections, like provided in the cross-connected transistor circuits 218A, 218B in the latch circuit 216 in FIG. 2, are complex to layout, especially if such cross-connections cross different gates. To illustrate this, FIG. 3 is provided that illustrates a layout 300 of a conventional standard cell 302. A latch circuit of a flip-flop, such as the latch circuit 216 in FIG. 2, can be laid out in the layout 300 to be used to fabricate the latch circuit. The standard cell 302 employs active devices (not shown) that can be used to form a circuit and that include corresponding gates 304(1)-304(4) disposed in a first direction 306 in a Y-axis direction with a defined gate pitch GP. The standard cell 302 includes a first voltage rail 308 disposed in a second direction 310 in an X-axis direction substantially orthogonal to the first direction 306 in a first metal layer 312 (e.g., a metal zero (M0) metal layer). The first voltage rail 308 corresponds to a first track 314(1) and is configured to receive a first voltage, such as a supply voltage. Additionally, the standard cell 302 includes a second voltage rail 316 disposed in the second direction 310 in the first metal layer 312. The second voltage rail 316 corresponds to a second track 314(2) and is configured to receive a second voltage, such as a ground voltage. The standard cell 302 also includes active areas 318P, 318N of P-type and N-type semiconductor materials, respectively, for forming active devices that include semi-conducting materials, such as transistors. The standard cell 302 also employs routing lines 320(1)-320(5) disposed in the second direction 310 in another first metal layer 322 (e.g., which may be a metal zero (M0) metal layer) between the first and second voltage rails 308, 316. The routing lines 320(1)-320(5) are used, in part, to interconnect elements in the standard cell 302 to form various devices, such as particular logic gates. Each routing line 320(1)-320(5) corresponds to a respective routing track 324(1)-324(4). To further assist in interconnecting elements in the standard cell 302, as well as to interconnect elements to the first and second voltage rails 308, 316, metal lines 326(1)-326(3) are disposed substantially in the first direction 306 in a second metal layer 328 (e.g., a metal one (M1) metal layer) between the respective gates 304(1)-304(4).

With continuing reference to FIG. 3, a gate contact 330(1) can be formed above the gate 304(1) and connected to metal line 326(1) outside the active area 318P to form a gate for a P-type semiconductor device formed in the active area 318P. A gate cut area 332 is formed in the routing line 320(4) and the second metal line 326(2) to provide isolation between the gate 304(2) and gate 304(3). A gate contact 330(3) can be formed above the gate 304(3) outside the active area 318N to form a gate for an N-type semiconductor device formed in the active area 318N. The gate contact 330(3) is provided to contact the second metal line 326(2) instead of the first metal line 326(1) because of the gate cut area 332. Thus, if it is desired to cross-connect a gate 304(1) of a P-type semiconductor device formed in the active area 318P with a gate 304(3) of an N-type semiconductor device formed in the active area 318N, a cross-connection must be made between metal lines 326(1) and 326(2). The gate cut area 332 prevents a direct connection from being made between gates 304(1), 304(3) through only metal line 326(1) or 326(2). Thus, another metal line (not shown) must be provided in a higher metal layer than the second metal layer 328 to provide a cross-connection between metal lines 326(1) and 326(2) to cross-connect the gate contact 330(1) with the gate contact 330(3). However, this consumes additional area in a semiconductor die in an undesired manner. Further, this additional area for providing cross-connections can be further exacerbated by a layout of circuits that include multiple cross-connections, such as the flip-flop 200 in FIG. 2.

SUMMARY OF THE DISCLOSURE

Aspects disclosed in the detailed description include cell circuits formed in circuit cells employing offset gate cut areas in a non-active area for routing transistor gate cross-connections. For example, such cell circuits may be circuits formed in a circuit cell, such as standard circuit cells, also known as a "standard cell." A standard cell is a standard layout of power rails, active areas for forming P-type and N-type semiconductor devices, and interconnect structures for forming circuits between the formed semiconductor devices for providing logic functions (e.g., logic gates) and/or storage functions (e.g., a flip-flop or latch). For example, it may be necessary to provide cross-connections between gates of transistors formed in a circuit cell to form an intended cell circuit. For example, cross-connections may be required between gates of PMOS and NMOS transistors that not aligned along the same gate structure in the circuit cell, and thus these cross-connections must be made across different gates.

Thus, in exemplary aspects disclosed herein, to allow for cross-connections across different gates between PMOS and NMOS transistors in a formed cell circuit, the gate contacts formed to contact metal lines formed in horizontal routing tracks in the circuit cell for making gate connections can optionally be formed as gate contacts over an active area (GCOA) if desired. For example, a self-aligned gate contact (SAGC) process may be employed to form the gate contacts over an active area. This allows the gate contacts to be formed in active diffusion areas of the circuit cell while avoiding shorting of gates of neighboring contacts. This allows for more area in the non-diffusion regions to provide interconnections in the circuit cell, which can avoid interconnections in higher metal layers. However, gate cut areas in gates may be required in the non-active areas to isolate different active gates for different active devices from each other, thus making it difficult or impossible to use the metal lines for making cross-connections across different gates between PMOS and NMOS transistors. Thus, in further exemplary aspects disclosed herein, to avoid having to make such cross-connections above the metal lines in the circuit cell, in upper metal layers, gate cut areas in the circuit cell are located in different horizontal routing tracks and offset from each other in the direction of the longitudinal axes of the gates to still provide isolation between different devices formed in the circuit cell while also allowing such gate cross-connections to be routed around the offset gate cut areas between different active gates. In this manner, as an example, fewer metal layers may be required to provide such cross-connections in the circuit cell, thus reducing area of the circuits formed in the circuit cell.

In this regard in one aspect, a cell circuit is provided. The cell circuit comprises a P-type diffusion region disposed above a substrate and having a longitudinal axis disposed in a first direction. The cell circuit also comprises an N-type diffusion region disposed above the substrate and having a longitudinal axis disposed in the first direction. The cell circuit also comprises a non-diffusion region disposed above the substrate between the P-type diffusion region and the N-type diffusion region. The cell circuit also comprises a first gate having a longitudinal axis and disposed in a second direction substantially orthogonal to the first direction. The cell circuit further comprises a second gate having a longitudinal axis substantially parallel to the longitudinal axis of the first gate. The second gate is disposed in the second direction substantially orthogonal to the first direction. The cell circuit also comprises a first metal line in a first metal layer extending in the first direction in a first routing track among a plurality of routing tracks extending in the first direction in the non-diffusion region, the first metal line electrically coupled to the second gate to form a second active gate in the second gate. The cell circuit also comprises a first gate cut area disposed in the first gate, and having a first latitudinal axis in the second direction and disposed in the first routing track adjacent to the first metal line. The cell circuit also comprises a second metal line in the first metal layer extending in the first direction in a second routing track among the plurality of routing tracks in the non-diffusion region, the second metal line electrically coupled to the first gate to form a first active gate in the first gate. The cell circuit also comprises a second gate cut area disposed in the second gate, and having a second latitudinal axis in the second direction substantially parallel to the first latitudinal axis and disposed in the second routing track adjacent to the second metal line, the second latitudinal axis of the second gate cut area offset from the first latitudinal axis of the first gate cut area in the second direction. The cell circuit also comprises a first cross-connect metal line disposed in a second metal layer above the first metal layer and extending in the second direction, the first cross-connect metal line electrically coupled to the first metal line and the second metal line electrically coupling the second active gate to the first active gate.

In another aspect, a method of cross-connecting gates of semiconductor devices formed in a circuit is provided. The method comprises forming a P-type diffusion region having a longitudinal axis disposed in a first direction above a substrate. The method also comprises forming an N-type diffusion region having a longitudinal axis disposed in the first direction above the substrate. The method also comprises forming a plurality of gates above the substrate, each having a longitudinal axis and disposed in a second direction substantially orthogonal to the first direction. The method also comprises cutting a first gate among the plurality of gates to form a first gate cut area having a first latitudinal axis in the second direction and disposed in a first routing track among a plurality of routing tracks. The method also comprises forming a first metal line in a first metal layer extending in the first direction in the first routing track extending in the first direction in a non-diffusion region between the P-type diffusion region and the N-type diffusion region, the first metal line electrically coupled to a second gate among the plurality of gates to form a second active gate in the second gate. The method also comprises cutting the second gate to form a second gate cut area having a second latitudinal axis in the second direction substantially parallel to the first latitudinal axis and disposed in a second routing track among the plurality of routing tracks, the second latitudinal axis of the second gate cut area offset from the first latitudinal axis of the first gate cut area in the second direction. The method also comprises forming a second metal line in the first metal layer extending in the first direction in the second routing track in the non-diffusion region, the second metal line electrically coupled to the first gate to form a first active gate in the first gate. The method also comprises forming a first cross-connect metal line disposed in a second metal layer above the first metal layer and extending in the second direction, the first cross-connect metal line electrically coupled to the first metal line and the second metal line electrically coupling the second active gate to the first active gate.

In another aspect, a latch circuit is provided. The latch circuit comprises a P-type diffusion region disposed above a substrate and having a longitudinal axis in a first direction. The latch circuit also comprises an N-type diffusion region disposed above the substrate and having a longitudinal axis in the first direction. The latch circuit also comprises a non-diffusion region disposed above the substrate between the P-type diffusion region and the N-type diffusion region. The latch circuit also comprises a first gate having a longitudinal axis and disposed in a second direction substantially orthogonal to the first direction. The latch circuit further comprises a second gate having a longitudinal axis substantially parallel to the longitudinal axis of the first gate. The second gate is disposed in the second direction substantially orthogonal to the first direction. The latch circuit also comprises a first PMOS transistor comprising a first PMOS active gate in the first gate, the first PMOS active gate in the non-diffusion region, a first PMOS source/drain in the P-type diffusion region, and a first PMOS drain/source in the P-type diffusion region. The latch circuit also comprises a first NMOS transistor comprising a first NMOS active gate in the first gate, the first NMOS active gate in the N-type diffusion region, a first NMOS source/drain in the N-type diffusion region, and a first NMOS drain/source in the N-type diffusion region. The latch circuit also comprises a first gate cut area disposed in the first gate in the non-diffusion region between the first PMOS active gate and the first NMOS active gate and electrically isolating the first PMOS active gate and the first NMOS active gate. The latch circuit also comprises a second PMOS transistor comprising a second PMOS active gate in the second gate, the second PMOS active gate in the P-type diffusion region and electrically coupled to the first NMOS active gate, a second PMOS source/drain in the P-type diffusion region, and a second PMOS drain/source in the P-type diffusion region. The latch circuit also comprises a second NMOS transistor comprising a second NMOS active gate in the second gate, the second NMOS active gate in the non-diffusion region and electrically coupled to the first PMOS active gate, a second NMOS source/drain in the N-type diffusion region, and a second NMOS drain/source in the N-type diffusion region. The latch circuit also comprises a second gate cut area disposed in the second gate in the non-diffusion region between the second PMOS active gate and the second NMOS active gate and electrically isolating the second PMOS active gate and the second NMOS active gate.

In another aspect, the latch circuit comprises an input node coupled to the second PMOS drain/source, and an output node coupled to the first PMOS drain/source.

BRIEF DESCRIPTION OF THE FIGURES

FIG. 4A is a block diagram of an exemplary flip-flop that includes latch circuits with cross-connected transistor gates;

FIG. 4B is a circuit diagram of the flip-flop in FIG. 4A;

DETAILED DESCRIPTION

Figures 1A, 1B:
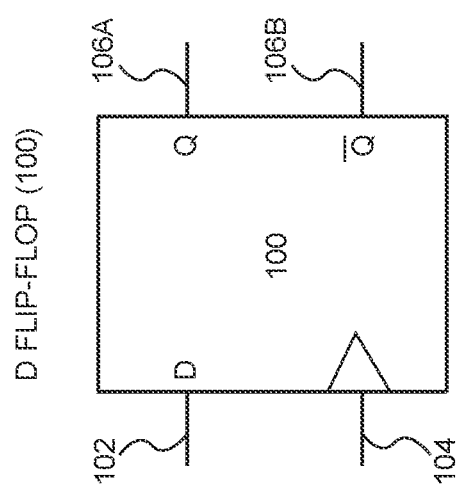
FIG. 1A is a schematic diagram of an exemplary D flip-flop.
FIG. 1B is a truth table for the D flip-flop in FIG. 1A.
Figure 2:
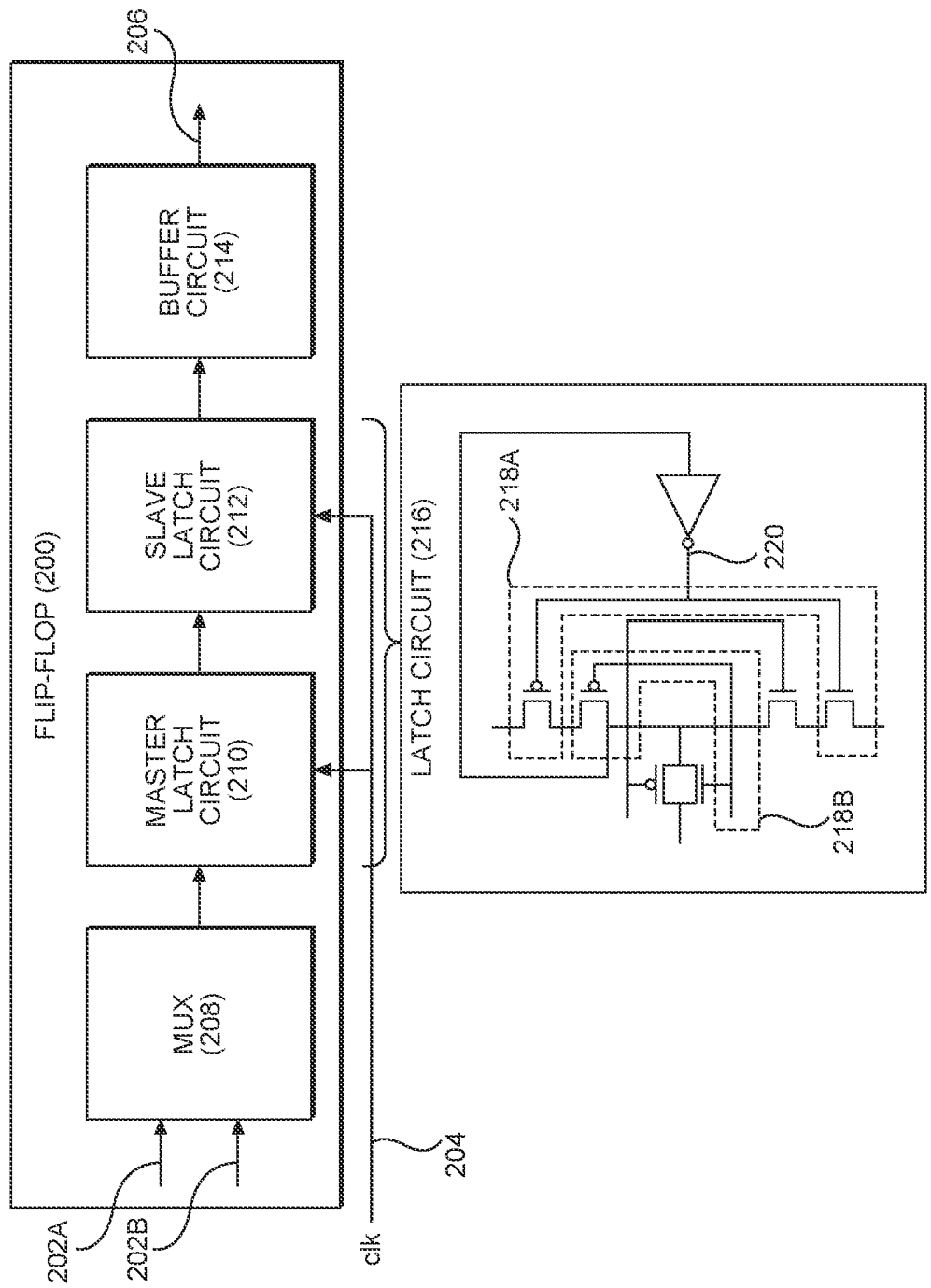
FIG. 2 is a block diagram of an exemplary flip-flop, and illustrates a circuit diagram of an exemplary latch circuit provided therein that includes cross-connected transistors.
Figure 3:
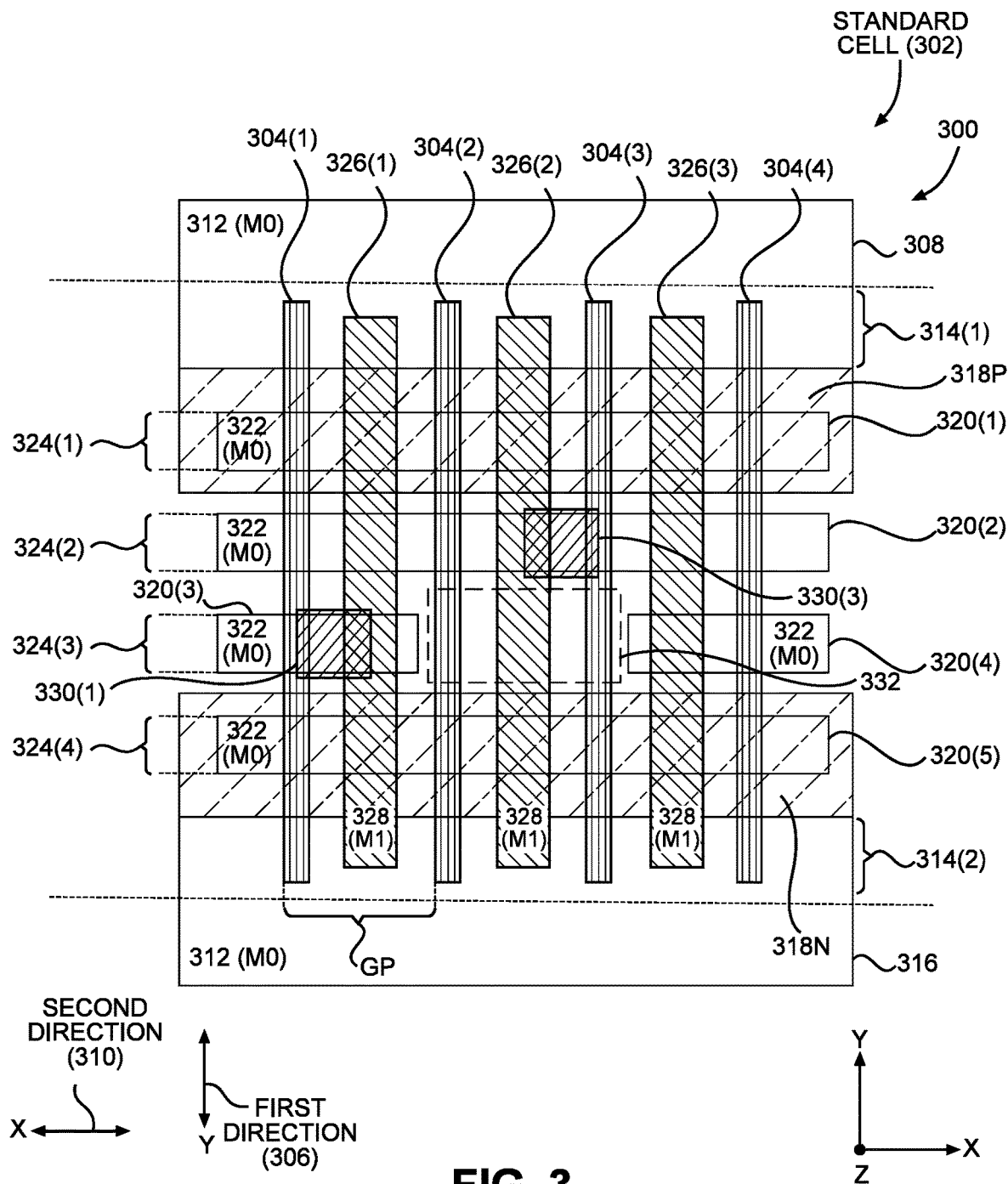
FIG. 3 is a top-view diagram of a conventional cell circuit with gate contacts formed in different active gates that are designed to be cross-connected around a gate cut area.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include cell circuits formed in circuit cells employing offset gate cut areas in a non-active area for routing transistor gate cross-connections. For example, such cell circuits may be circuits formed in a circuit cell, such as standard circuit cells, also known as a "standard cell." A standard cell is a standard layout of power rails, active areas for forming P-type and N-type semiconductor devices, and interconnect structures for forming circuits between the formed semiconductor devices for providing logic functions (e.g., logic gates) and/or storage functions (e.g., a flip-flop or latch). For example, it may be necessary to provide cross-connections between gates of transistors formed in a circuit cell to form an intended cell circuit. For example, cross-connections may be required between gates of PMOS and NMOS transistors that not aligned along the same gate structure in the circuit cell, and thus these cross-connections must be made across different gates.

Thus, in exemplary aspects disclosed herein, to allow for cross-connections across different gates between PMOS and NMOS transistors in a formed cell circuit, the gate contacts formed to contact metal lines formed in horizontal routing tracks in the circuit cell for making gate connections can optionally be formed as gate contacts over an active area (GCOA) if desired. For example, a self-aligned gate contact (SAGC) process may be employed to form the gate contacts over an active area. This allows the gate contacts to be formed in active diffusion areas of the circuit cell while avoiding shorting of gates of neighboring contacts. This allows for more area in the non-diffusion regions to provide interconnections in the circuit cell, which can avoid interconnections in higher metal layers. However, gate cut areas in gates may be required in the non-active areas to isolate different active gates for different active devices from each other, thus making it difficult or impossible to use the metal lines for making cross-connections across different gates between PMOS and NMOS transistors. Thus, in further exemplary aspects disclosed herein, to avoid having to make such cross-connections above the metal lines in the circuit cell, in upper metal layers, gate cut areas in the circuit cell are located in different horizontal routing tracks and offset from each other in the direction of the longitudinal axes of the gates to still provide isolation between different devices formed in the circuit cell while also allowing such gate cross-connections to be routed around the offset gate cut areas between different active gates. In this manner, as an example, fewer metal layers may be required to provide such cross-connections in the circuit cell, thus reducing area of the circuits formed in the circuit cell.

Before discussing exemplary circuit cells that employ offset gate cut areas in a non-active area for routing transistor gate cross-connections for circuits formed therein starting at FIG. 5, an exemplary circuit that includes transistor gate cross-connections that can be realized in such circuit cells is shown in FIGS. 4A and 4B and described below.

In this regard, FIG. 4A is a block diagram of an exemplary asynchronous reset flip-flop circuit 400 ("flip-flop 400") that is described in U.S. Patent Application Publication No. 2014/0306735 A1 incorporated herein by reference in its entirety. As will be discussed below, the flip-flop 400 includes latch circuits that have cross-connected transistor gates. The flip-flop 400 includes control inputs 402A, 402B, a clock input 404 to receive a clock signal clk, and outputs 406A, 406B. The flip-flop 400 includes a multiplexer circuit (MUX) 408 that is configured to select between the different control inputs 402A, 402B to couple a signal on the control inputs 402A, 402B to a master latch circuit 410. The master latch circuit 410 stores a logic state of the signal on the selected control input 402A, 402B. The master latch circuit 410 is configured to store an inverted logic state of the signal on the selected control input 402A, 402B and output the stored logic state to a slave latch circuit 412 in response to the clock signal clk on the clock input 404. The slave latch circuit 412 is configured to store an inverted logic state of the logic state stored in the master latch circuit 410 and output the stored logic state to a buffer circuit 414 in response to the clock signal clk on the clock input 404.

The master latch circuit 410 and the slave latch circuit 412 in this example each include cross-connected transistor circuits that serve to reinforce a logic state stored by the respective master latch circuit 410 and slave latch circuit 412. This is shown in a more detailed circuit diagram of the flip-flop 400 in FIG. 4B. In this regard, the flip-flop 400 includes the multiplexor circuit (MUX) 408, the master latch circuit 410, the slave latch circuit 412, and the buffer circuit 414 shown in FIG. 4A. The flip-flop 400 is configured to receive a clock signal clk on the clock input 404, a control signal 418, and control signals 403A, 403B, and 420. The flip-flop 400 also includes transistors 422-436, inverters 438-442, a NAND logic gate 444, outputs 406A, 406B, and a NOR logic gate 446. The transistors 422, 424, 426, 428 form a first transistor stack, and the transistors 430, 432, 434, 436 form a second transistor stack (also referred to herein as "transistor stacks 422-436"). The two four-transistor stacks 422-436 are responsive to the control signals 420, 403A, and 403B to provide an output to the master latch circuit 410.

With continuing reference to FIG. 4B, the master latch circuit 410 includes a pass gate 448, a NOR logic gate 450, two N-type metal-oxide semiconductor (MOS) (NMOS) transistors 452, 454, and two P-type MOS (PMOS) transistors 456, 458. An input 460 of the pass gate 448 is coupled to an output 462 of the two four-transistor stacks 422-436, and an output 464 of the pass gate 448 may be coupled to an input of a latch formed by the NMOS and PMOS transistors 452 and 458, and the NOR logic gate 450. The NMOS transistor 454 and the PMOS transistor 456 operate as isolation devices to reduce contention during latching of data received via the pass gate 448. The NOR logic gate 450 may have a first input coupled to the output 464 of the pass gate 448 and a second input coupled to the control signal 418. An output 482 of the NOR logic gate 450 may provide an output signal of the master latch circuit 410 to a pass gate 468 (e.g., a transmission gate) of the slave latch circuit 412 and to the NMOS transistor 452 and to the PMOS transistor 458. The NOR logic gate 450 and the NMOS and PMOS transistors 452-458 operate to latch a data value at the output 482 of the master latch circuit 410 when the control signal 418 is a logical zero ('0') and to output a logical zero ('0') value when the control signal 418 is a logical one.

With continuing reference to FIG. 4B, the slave latch circuit 412 includes the pass gate 468, an inverter 470, NMOS transistors 472, 474, and PMOS transistors 476, 478. The pass gate 468 has an input 480 responsive to the output 482 of the NOR logic gate 450 of the master latch circuit 410, and has an output 484 coupled to an input of a latch formed from the inverter 470, the NMOS transistor 472, and the PMOS transistor 478. An output 486 of the inverter 470 may be coupled to one input of the NAND logic gate 444 and the control signal 420 may be coupled to a second input of the NAND logic gate 444. An output 477 of the NAND logic gate 444 may be coupled to the output 406B. The output 486 of the inverter 470 is coupled to an input 488 of the inverter 442, and an output 490 of the inverter 442 is coupled to the output 406A. The master latch circuit 410 is coupled to the control signals 420, 403A, 403B through the first transistor stack 422-428, the second transistor stack 430-436, and the inverter 440. The slave latch circuit 412 is coupled to the master latch circuit 410 at the output 482 of the NOR logic gate 450. The slave latch circuit 412 is coupled to the outputs 406A, 406B through the NAND logic gate 444 and the inverter 442. The pass gate 448 of the master latch circuit 410 and the pass gate 468 of the slave latch circuit 412 are coupled to the clock input 404 via the NOR logic gate 446 and the inverter 438.

As shown in FIG. 4B, both the master latch circuit 410 and the slave latch circuit 412 include transistors whose gates are cross-connected. For example, in the master latch circuit 410, a gate of a PMOS transistor 492 of the pass gate 448 is connected to a gate of the NMOS transistor 454, and a gate of an NMOS transistor 494 of the pass gate 448 is connected to a gate of the PMOS transistor 456. In the slave latch circuit 412, a gate of a PMOS transistor 496 of the pass gate 468 is connected to a gate of the NMOS transistor 474, and a gate of an NMOS transistor 498 of the pass gate 468 is connected to a gate of the PMOS transistor 476. This repeated structure is shown in a latch circuit 500 in the circuit diagram in FIG. 5. The latch circuit 500 is labeled with element numbers of both the master latch circuit 410 and the slave latch circuit 412 for convenience in referencing these structures in the flip-flop 400 in FIG. 4B.

Figures 5, 6:
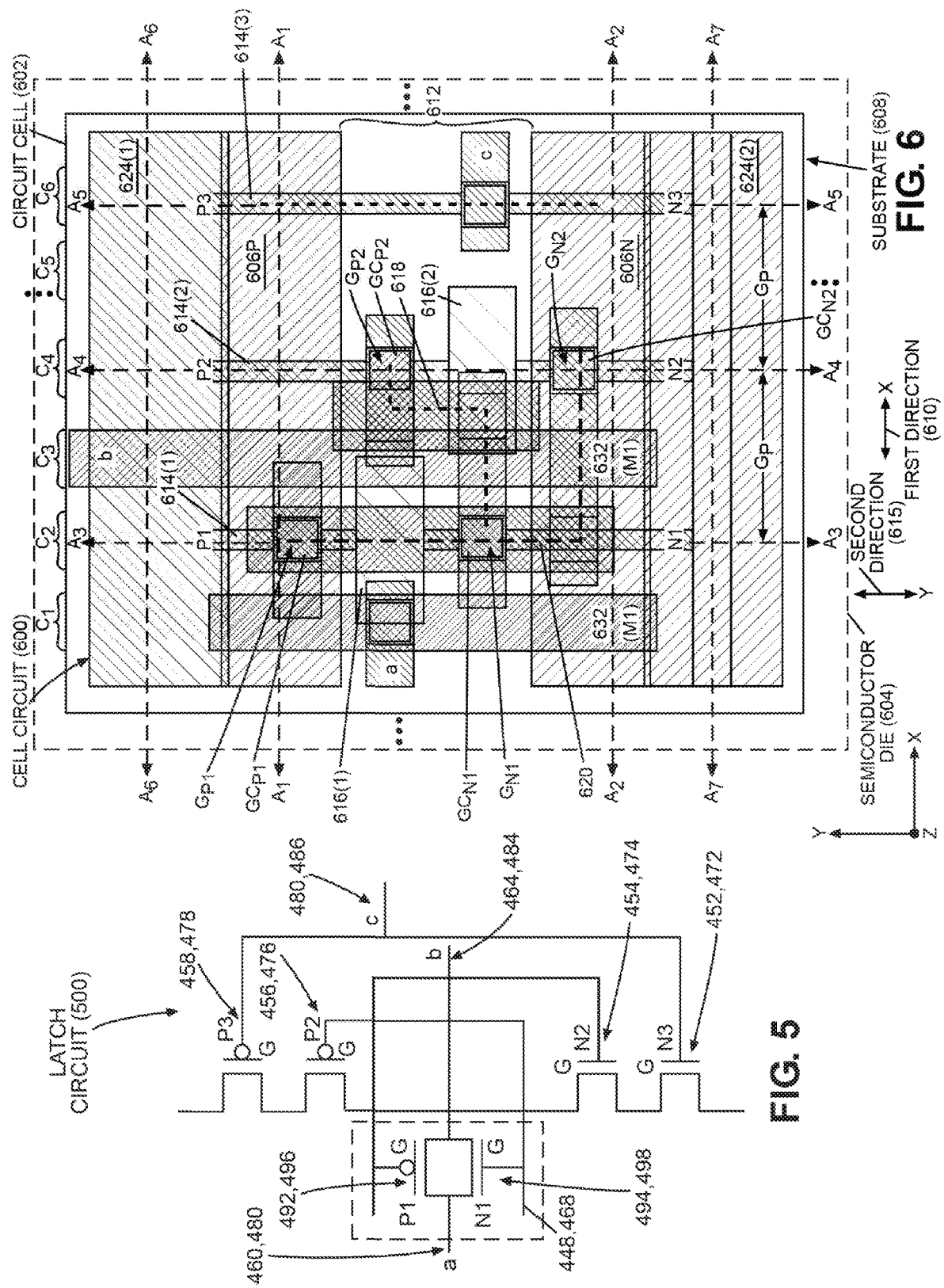
FIG. 5 is a circuit diagram of a latch circuit in the flip-flop in FIGS. 4A and 4B illustrating cross-connected transistor gates.
FIG. 6 is diagram of an exemplary cell circuit formed in a circuit cell in a semiconductor die illustrating an exemplary layout of formed transistors in a circuit cell for the latch circuit in FIG. 5, wherein gate contacts for transistors are formed over active areas in metal lines and cross-connected through metal lines routed around offset gate cut areas in a non-active area.

In this regard, with reference to FIG. 5, input 'a' in the latch circuit 500 in FIG. 5 can be the input 460 in the master latch circuit 410 or the input 480 in the slave latch circuit 412. Output 'b' in the latch circuit 500 in FIG. 5 can be the output 464 in the master latch circuit 410 or the output 484 in the slave latch circuit 412. Output 'c' in the latch circuit 500 in FIG. 5 can be the output 482 (input 480) for the master latch circuit 410 or the output 486 for the slave latch circuit 412. A PMOS transistor P1 in the latch circuit 500 in FIG. 5 can be the PMOS transistor 492 in the pass gate 448 in the master latch circuit 410 or the PMOS transistor 496 in the pass gate 468 in the slave latch circuit 412. An NMOS transistor N1 in the latch circuit 500 in FIG. 5 can be the NMOS transistor 494 in the pass gate 448 in the master latch circuit 410 or the NMOS transistor 498 in the pass gate 468 in the slave latch circuit 412. A PMOS transistors P2 and P3 in the latch circuit 500 in FIG. 5 can be the PMOS transistors 456, 458 in the master latch circuit 410 or the PMOS transistors 476, 478 in the slave latch circuit 412. NMOS transistors N3 and N2 in the latch circuit 500 in FIG. 5 can be the NMOS transistors 452, 454 in the master latch circuit 410 or the NMOS transistors 472, 474 in the slave latch circuit 412. A gate G of the PMOS transistor P1 is connected to a gate G of the NMOS transistor N2. The gate G of the NMOS transistor N1 is connected to a gate G of the PMOS transistor P2.

The flip-flop 400 in FIGS. 4A and 4B can be laid out in a circuit cell(s) such as a "standard cell," for ease in semiconductor device layout and fabrication. A standard cell is a layout of power rails, gates, active diffusion areas, and interconnect structures in pre-defined areas to provide a common methodology for forming transistor devices, such as gates or storage circuits (e.g., a flip-flop or latch). Using a standard cell design for semiconductor manufacturing in essence provides design rules for forming semiconductor devices in a digital design of circuits in a semiconductor die. Metal lines are formed in metal layers in the circuit cell to provide for the ability to interconnect semiconductor devices fabricated in the circuit cell to form circuits. However, it is desired to minimize the area of the circuit cell. For example, it is desired to minimize the number of metal layers used to provide interconnections between the semiconductor devices formed in a circuit cell. However, depending on the semiconductor devices formed in the circuit cell, it may be difficult to provide interconnections without employing interconnect structures in higher metal layers, such as metal 2 (M2) and above. This issue can be further exacerbated when it is necessary to interconnect gates of PMOS and NMOS transistors which are fabricated in different diffusion regions of a circuit cell, and where such transistors have active gates formed from different gate structures that are located in different areas of the circuit cell. For example, such is the case in the flip-flop 400 in FIGS. 4A and 4B, where as previously discussed, gates of PMOS transistors are interconnected to gates of NMOS devices.

Thus, in exemplary aspects disclosed herein, to allow for cross-connections across different gates between PMOS and NMOS transistors in a formed cell circuit, gate contacts formed to contact the metal lines formed in horizontal routing tracks in the circuit cell for making gate connections can optionally be formed as gate contacts over an active area (GCOA) if desired, such as by using a SAGC process. This allows other gate contacts to be formed in non-active areas of the circuit cell to allow routing of gate cross-connections across different gates in the non-active area of the circuit cell. GCOA can avoid shorting of gates of neighboring contacts, thus allowing for more area to provide cross-connections in the non-active area of the circuit cell. However, gate cut areas in gates may be required in the non-active areas to isolate different active gates for different active devices from each other, thus making it difficult or impossible to use the metal lines for making cross-connections across different gates between PMOS and NMOS transistors. Thus, in further exemplary aspects disclosed herein, to avoid having to make such cross-connections above the metal lines in the circuit cell, in upper metal layers, gate cut areas in the circuit cell are located in different horizontal routing tracks and offset from each other in the direction of the longitudinal axes of the gates to still provide isolation between different devices formed in the circuit cell, while also allowing such gate cross-connections to be routed around the offset gate cut areas between different active gates. In this manner, as an example, fewer metal layers may be required to provide such cross-connections in the circuit cell, thus reducing area of the circuits formed in the circuit cell.

In this regard, FIG. 6 is diagram of an exemplary cell circuit 600 formed in a circuit cell 602 in a semiconductor die 604. In this example, the cell circuit 600 includes part of a latch circuit, such as the master latch circuit 410 or the slave latch circuit 412 in the flip-flop 400 in FIGS. 4A and 4B. The circuit cell 602 includes a P semiconducting material type (P-type) diffusion region 606P disposed above a substrate 608 and having a longitudinal axis $A_1$ disposed in a first direction 610 in an X-axis direction. The circuit cell 602 also includes an N semiconducting material type (N-type) diffusion region 606N disposed above the substrate 608 and having a longitudinal axis $A_2$ disposed in the first direction 610 in the X-axis direction. A non-active, non-diffusion region 612 is disposed above the substrate 608 between the P-type diffusion region 606P and the N-type diffusion region 606N. A plurality of gates 614(1)-614(3) are formed from a gate material (e.g., a polysilicon), each having a respective longitudinal axis $A_3$-$A_5$, respectively, and disposed in a second direction 615 in a Y-axis direction substantially orthogonal to the first direction 610. Routing columns $C_1$-$C_6$ are column areas extending in the second direction 615 in the circuit cell 602 for the routing of the gates 614(1)-614(3) and metal lines for making interconnections. Each gate 614(1)-614(3) is separated from an adjacent gate 614(1)-614(3) by a gate pitch $G_P$. First and second gate cut areas 616(1), 616(2) are formed in respective first and second gates 614(1), 614(2) to form separate active gates $G_{P1}$, $G_{P2}$ for first and second PMOS transistors P1, P2, and separate active gates $G_{N1}$, $G_{N2}$ for first and second NMOS transistors N1, N2. The first and second PMOS transistors P1, P2 and the first and second NMOS transistors N1, N2 correspond to the PMOS transistors P1, P2 and NMOS transistors N1, N2, respectively, shown in FIG. 5 in this example.

As will be discussed in more detail below, active gate $G_{P2}$ of the second PMOS transistor P2 and active gate $G_{N1}$ of the neighboring first NMOS transistor N1 formed in the circuit cell 602 are cross-connected through metal lines routed around the first and second gate cut areas 616(1), 616(2) in the non-diffusion region 612. As discussed in more detail below, the gate cut areas 616(1), 616(2) are separated from each other in the second direction 615 and offset from each other in the first direction 610 in the circuit cell 602. This allows active gate $G_{P2}$ to be cross-connected through metal lines (see cross-connection 618) around the gate cut areas 616(1), 616(2) without extending above a metal one (M1) layer in this example. Further, providing for cross-connections to be routed around the gate cut areas 616(1), 616(2) in the non-diffusion region 612 may also allow a reduction in the number of metal tracks included in the circuit cell 602 for making interconnections as well, thus saving additional area. This reduces layout complexity and area by being able to avoid providing metal interconnections for making cross-connections between neighboring devices in higher metal layers. This area savings is multiplied for circuits, such as the flip-flop 400 in FIGS. 4A and 4B, since this circuit includes multiple circuits that include cross-connections between neighboring transistors. Laying out cross-connections between neighboring PMOS and NMOS transistors having active gates formed from different gates are harder, because interconnections have to cross different gates. On the other hand, laying out cross-connections between PMOS and NMOS transistors having active gates formed from the same gate (e.g., the third gate 614(3) in FIG. 6) is easier, because interconnections do not have to cross different gates. A gate cut area in the gate is not needed, because the gate can be left as a continuous structure to provide the gate cross-connection. Also in this example, active gate $G_{P1}$ of the first PMOS transistor P1 and active gate $G_{N2}$ of the neighboring, second NMOS transistor N2 are formed in the circuit cell 602 to be cross-connected through metal lines (see cross-connection 620). More detail regarding these exemplary aspects will be discussed below with reference to FIG. 7.

With reference back to FIG. 6, the active gate $G_{P1}$ of the first PMOS transistor P1 and active gate $G_{N2}$ of the second NMOS transistor N2 are formed by GCOAs $GC_{P1}$, $GC_{N2}$ ("gate contacts $GC_{P1}$, $GC_{N2}$") in this example. More detail regarding SAGCs and the process of forming GCOAs during fabrication will be discussed in more detail below with regard to FIGS. 7 and 9A-9H. Forming the gates as GCOAs, such as by using a SAGC process, allows the gate contacts $GC_{P1}$, $GC_{N2}$ to be formed in the P-type and N-type diffusion regions 606P, 606N of the circuit cell 602 without the risk of shorting of gates of neighboring contacts. Being able to form active gates in the P-type and N-type diffusion regions 606P, 606N allows for more area in the non-diffusion region 612 to provide interconnections to avoid having to make interconnections in higher metal layers. The active gate $G_{P2}$ of the second PMOS transistor P2 and active gate $G_{N1}$ of the first NMOS transistor N1 can also be formed as GCOAs in this example.

Figure 7:
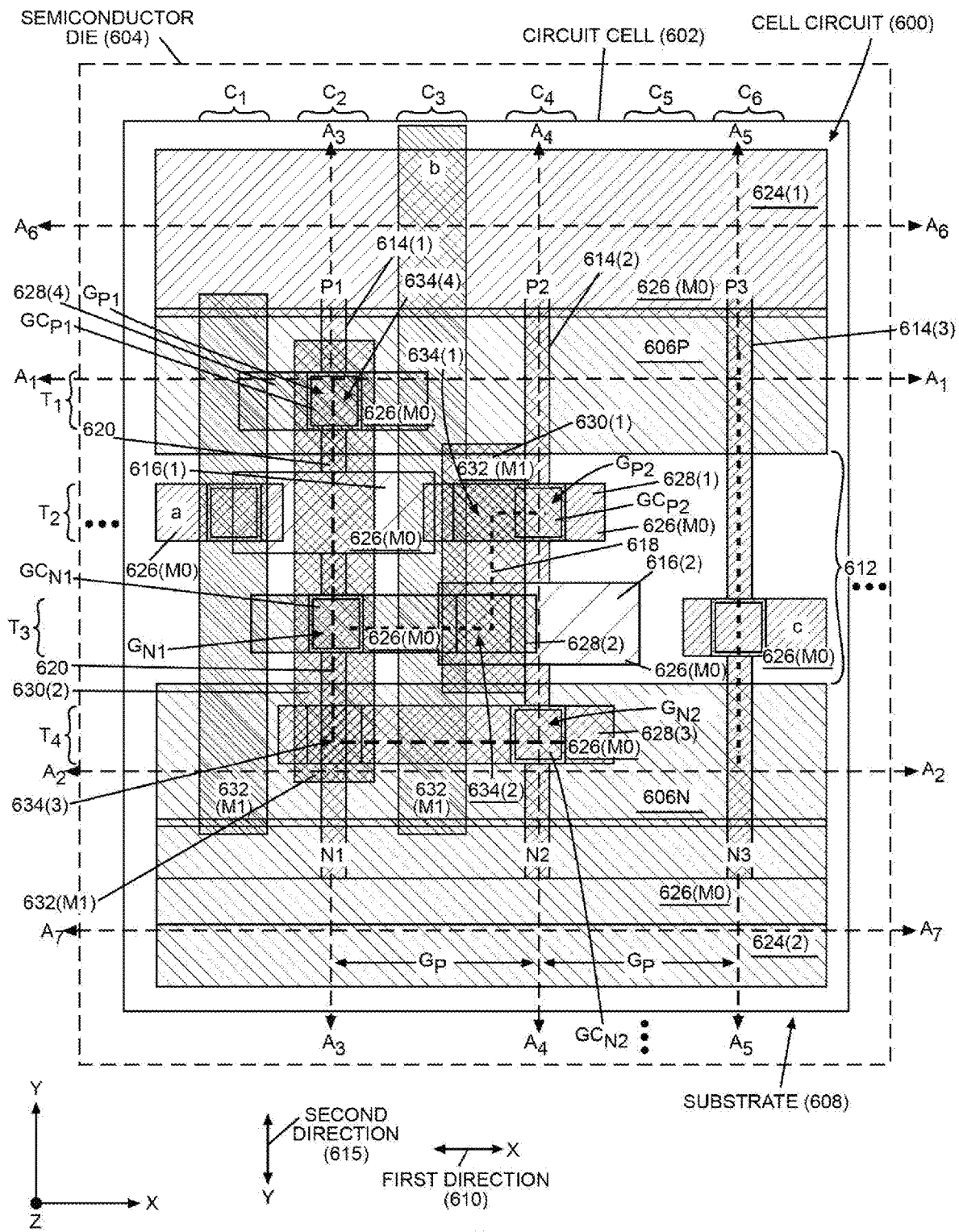
FIG. 7 is a more detailed diagram of the cell circuit formed in the circuit cell in FIG. 6.

FIG. 7 is a more detailed diagram of the circuit cell 602 in FIG. 6 with the cell circuit 600 formed therein. The elements previously described above in FIG. 6 for the circuit cell 602 are also illustrated in FIG. 7 with the same element numbers. As discussed above in FIG. 6, the circuit cell 602 in FIG. 7 includes the P-type diffusion region 606P disposed above the substrate 608 and having the longitudinal axis $A_1$ disposed in the first direction 610. For example, P-channels for PMOS transistors can be formed in the P-type diffusion region 606P. The circuit cell 602 also includes the N-type diffusion region 606N disposed above the substrate 608 and having the longitudinal axis $A_2$ disposed in the first direction 610. For example, N-channels for NMOS transistors can be formed in the N-type diffusion region 606N. The circuit cell 602 also includes the non-diffusion region 612 disposed above the substrate 608 between the P-type diffusion region 606P and the N-type diffusion region 606N. As will be discussed in more detail below, the non-diffusion region 612 includes area for providing metal lines for making interconnections between active semiconductor devices formed in the P-type diffusion region 606P and the N-type diffusion region 606N. The circuit cell 602 also includes a first voltage rail 624(1) adjacent to the P-type diffusion region 606P and having a longitudinal axis $A_6$ disposed in the first direction 610. The first voltage rail 624(1) is disposed in a first metal layer 626 (e.g., a metal zero (M0) metal layer) and is configured to receive a first voltage. The circuit cell 602 also includes a second voltage rail 624(2) adjacent to the N-type diffusion region 606N and having a longitudinal axis $A_7$ disposed in the first direction 610. The second voltage rail 624(2) is also disposed in the first metal layer 626 (e.g., a metal zero (M0) metal layer) and is configured to receive a second voltage.

With continuing reference to FIG. 7, the circuit cell 602 also includes the plurality of gates 614(1)-614(3) each having a respective longitudinal axis $A_3$-$A_5$ disposed in the second direction 615 substantially orthogonal to the first direction 610. The gates 614(1)-614(3) from the P-type diffusion region 606P to the N-type diffusion region 606N and through the non-diffusion region 612 of the circuit cell 602 are in respective routing columns $C_2$, $C_4$, $C_6$ are as shown in FIG. 7. Routing columns $C_1$-$C_6$ are column areas extending in the second direction 615 in the circuit cell 602 for the routing of the gates 614(1)-614(3) and metal lines for making interconnections. The gates 614(1)-614(3) formed in the routing columns $C_2$, $C_4$, $C_6$ do not overlap. The gates 614(1)-614(3) are fabricated from a gate material, such as a polysilicon, and are initially fabricated as continuous field gates. During the fabrication process, area of the gates 614(1)-614(3) in the non-diffusion region 612 can be cut in gate cut areas, such as the gate cut areas 616(1), 616(2), if an active gate of a P-type semiconductor device is not connected to an active gate of an N-type semiconductor device.

With continuing reference to FIG. 7, the circuit cell 602 includes a plurality of routing tracks $T_1$-$T_4$ extending in the first direction 610 for laying out metal lines in the first metal layer 626 to be used to establish interconnections. The routing tracks $T_1$-$T_4$ are disposed between the first and second voltage rails 624(1), 624(2). For example, as shown in FIG. 7, the circuit cell 602 has a first metal line 628(1) in the first metal layer 626 extending in the first direction 610 in a routing track $T_2$ extending in the first direction 610 in the non-diffusion region 612. The first metal line 628(1) extends into routing columns $C_3$ and $C_4$ in this example. The first metal line 628(1) is electrically coupled to the active gate $G_{P2}$ for a PMOS transistor for establishing an interconnection to the active gate $G_{P2}$. The second gate cut area 616(2) has a latitudinal axis along axis $A_4$ in the second direction 615 and disposed in a routing track $T_3$ adjacent to the first metal line 628(1). The second gate cut area 616(2) does not extend to the active gate $G_{N1}$ in the routing track $T_3$ in this example. The second gate cut area 616(2) cuts the second gate 614(2), because the design of the cell circuit 600 does not call for active gate $G_{P2}$ to be connected to the active gate $G_{N2}$ for an NMOS transistor. Instead, the design of the cell circuit 600 calls for the active gate $G_{P2}$ to be cross-connected to active gate $G_{N1}$.

In this regard, the circuit cell 602 has a second metal line 628(2) in the first metal layer 626 extending in the first direction 610 in the routing track $T_3$ extending in the first direction 610 in the non-diffusion region 612. The second metal line 628(2) is electrically coupled to the active gate $G_{N1}$ for establishing an interconnection to the active gate $G_{N1}$. The second metal line 628(2) extends into routing columns $C_2$, $C_3$, and $C_4$ in this example. The first gate cut area 616(1) having a latitudinal axis along axis $A_3$ in the second direction 615 is disposed in the routing track $T_2$ adjacent to the second metal line 628(2). The first gate cut area 616(1) does not extend to the active gate $G_{P2}$ in the routing track $T_2$ in this example. The first gate cut area 616(1) cuts the first gate 614(1), because the active gate $G_{N1}$ is connected to the active gate $G_{P2}$ and not active gate $G_{P1}$. The first and second metal lines 628(1) and 628(2) are interconnected via a first cross-connect metal line 630(1) disposed in a second metal layer 632 (e.g., metal one (M1) layer) above the first metal layer 626 and extending in the second direction 615. The first cross-connect metal line 630(1) extends into routing columns $C_3$ and $C_4$ in this example. The first cross-connect metal line 630(1) is electrically coupled to the first metal line 628(1) and the second metal line 628(2) through respective vertical interconnect accesses (VIAs) 634(1), 634(2), thus electrically coupling the first metal line 628(1) to the second metal line 628(2) to electrically cross-connect the active gate $G_{P2}$ to the active gate $G_{N1}$. This is possible, because the first gate cut area 616(1) is aligned with the routing track $T_2$ and the second gate cut area 616(2) is aligned in adjacent routing track $T_3$. The latitudinal axis $A_3$ of the first gate cut area 616(1) is offset from the latitudinal axis $A_4$ of the second gate cut area 616(2) in the second direction 615. This allows the first cross-connect metal line 630(1) to be routed down around the first gate cut area 616(1) and then extended over to the active gate $G_{N1}$ through the second metal line 628(2) around and below the first gate cut area 616(1) to form the cross-connection 618. Thus in this example, the cross-connection 618 can be formed by the first and second metal lines 628(1), 628(2) in the first metal layer 626 and the first cross-connect metal line 630(1) in the second metal layer 632 without having to employ interconnect structures above the second metal layer 632. In this example, the first cross-connect metal line 630(1) does not extend into a metal layer above the second metal layer 632. Providing the offset first and second gate cut areas 616(1), 616(2) to allow interconnects to be routed around the gate cut areas 616(1), 616(2) may also provide sufficient room for routing interconnections such that the routing tracks $T_1$-$T_4$ in the circuit cell 602 can be reduced to four (4) total in this example of the circuit cell 602 instead of five (5) or greater.

The circuit cell 602 in FIG. 7 also facilitates the cross-connection of the active gate $G_{P1}$ to active gate $G_{N2}$. In this regard, the circuit cell 602 has a third metal line 628(3) in the first metal layer 626 extending in the first direction 610 in a routing track $T_4$ extending in the first direction 610 in the N-type diffusion region 606N. The third metal line 628(3) extends into routing columns $C_2$, $C_3$, and $C_4$ in this example. The third metal line 628(3) is electrically coupled to the active gate $G_{N2}$ for establishing an interconnection to the active gate $G_{N2}$. The circuit cell 602 also has a fourth metal line 628(4) in the first metal layer 626 extending in the first direction 610 in a routing track $T_1$ extending in the first direction 610 in the P-type diffusion region 606P. The fourth metal line 628(4) is electrically coupled to the active gate $G_{P1}$ for establishing an interconnection to the active gate $G_{P1}$. The fourth metal line 628(4) extends into routing columns $C_1$, $C_2$, and $C_3$ in this example. The third and fourth metal lines 628(3) and 628(4) are interconnected via a second cross-connect metal line 630(2) disposed in the second metal layer 632 (e.g., metal one (M1) layer) above the first metal layer 626 and extending in the second direction 615 to establish an interconnection between active gates $G_{N2}$ and $G_{P1}$. The second cross-connect metal line 630(2) extends into routing column $C_2$ in this example. The second cross-connect metal line 630(2) is electrically coupled to the third metal line 628(3) and the fourth metal line 628(4) through respective vertical interconnect accesses (VIAs) 634(3), 634(4), thus electrically coupling the third metal line 628(3) to the fourth metal line 628(4) to electrically cross-connect the active gate $G_{P1}$ to the active gate $G_{N2}$. This second cross-connect metal line 630(2) is routed down around the first gate cut area 616(1) to form the cross-connection 620. Thus in this example, the cross-connection 620 can be formed by the third and fourth metal lines 628(3), 628(4) in the first metal layer 626 and the second cross-connect metal line 630(2) in the second metal layer 632 without having to employ interconnect structures above the second metal layer 632. In this example, the second cross-connect metal line 630(2) does not extend into a metal layer above the second metal layer 632.

Figure 8:
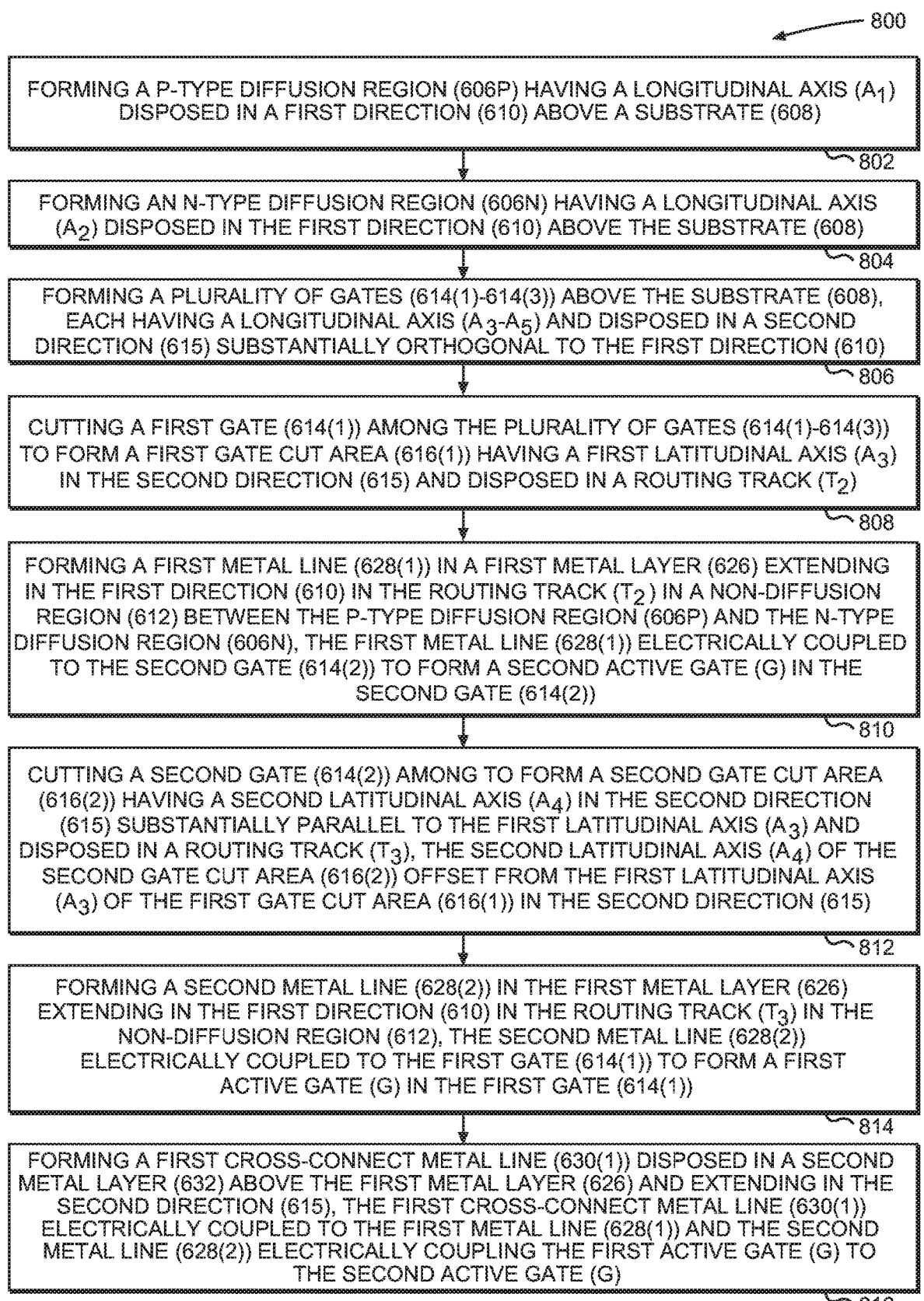
FIG. 8 is a flowchart illustrating an exemplary process of fabricating cross-connected transistor gates in the circuit cell in FIGS. 6 and 7.

FIG. 8 is a flowchart illustrating an exemplary process 800 of fabricating cross-connected transistor gates in the circuit cell 602 in FIGS. 6 and 7. The process 800 includes forming a P-type diffusion region 606P having a longitudinal axis $A_1$ disposed in a first direction 610 above a substrate 608 (block 802). The process 800 also includes forming an N-type diffusion region 606N having a longitudinal axis $A_2$ disposed in the first direction 610 above the substrate 608 (block 804). The process 800 also includes forming a plurality of gates 614(1)-614(3) above the substrate 608, each having a longitudinal axis $A_3$-$A_5$ and disposed in a second direction 615 substantially orthogonal to the first direction 610 (block 806). The process 800 also includes cutting a first gate 614(1) among the plurality of gates 614(1)-614(3) to form a first gate cut area 616(1) having a first latitudinal axis $A_3$ in the second direction 615 and disposed in a routing track $T_2$ (block 808). The process 800 also includes forming a first metal line 628(1) in a first metal layer 626 extending in the first direction 610 in the routing track $T_2$ in the non-diffusion region 612 between the P-type diffusion region 606P and the N-type diffusion region 606N, the first metal line 628(1) electrically coupled to the second gate 614(2) to form a second active gate G (e.g., active gate $G_{P2}$) in the second gate 614(2) (block 810). The process 800 also includes cutting the second gate 614(2) among the plurality of gates 614(1)-614(3) to form a second gate cut area 616(2) having a second latitudinal axis $A_4$ in the second direction 615 substantially parallel to the first latitudinal axis $A_3$ and disposed in a routing track $T_3$, the second latitudinal axis $A_4$ of the second gate cut area 616(2) offset from the first latitudinal axis $A_3$ of the first gate cut area 616(1) in the second direction 615 (block 812). The process 800 also includes forming a second metal line 628(2) in the first metal layer 626 extending in the first direction 610 in the routing track $T_3$ in the non-diffusion region 612, the second metal line 628(2) electrically coupled to the first gate 614(1) to form a first active gate G (e.g., $G_{N1}$) in the first gate 614(1) (block 814). The process 800 also includes forming a first cross-connect metal line 630(1) disposed in a second metal layer 632 above the first metal layer 626 and extending in the second direction 615, the first cross-connect metal line 630(1) electrically coupled to the first metal line 628(1) and the second metal line 628(2) electrically coupling the second active gate G to the first active gate G (block 816).

FIGS. 9A-9H illustrate side views of exemplary process stages of fabricating self-aligned gate contacts in a semiconductor device, such as the semiconductor die 604 in FIGS. 6 and 7, such as if active gate contacts $GC_{N2}$ and $GC_{P2}$ were fabricated as GCOAs. As discussed above, the active gate contacts $GC_{N2}$ and $GC_{P2}$ in the circuit cell 602 in FIGS. 6 and 7 can be fabricated as GCOAs. The active gate contacts $GC_{P1}$ and $GC_{N2}$ in the circuit cell 602 in FIGS. 6 and 7 can also be fabricated as GCOAs. Process stages of a fabrication process are shown as cross-sectional views of formation of a semiconductor device. The semiconductor device in FIGS. 9A-9H is a fin-type semiconductor device.

Figure 9A:
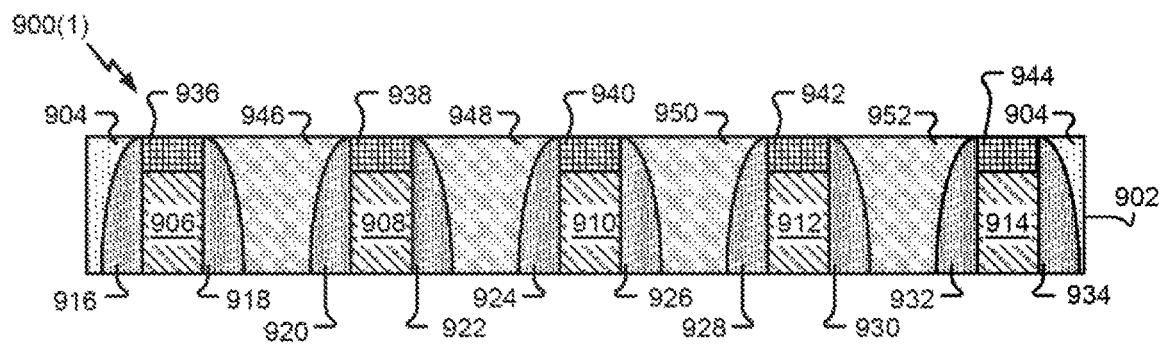
FIGS. 9A-9H illustrate exemplary process stages of fabricating a semiconductor device, such as the transistors in the circuit cell in FIGS. 6 and 7 with cross-connected active gates, that includes self-aligned gate contacts for the active gates.

Referring to FIG. 9A, a first stage 900(1) of the fabrication process is depicted. FIG. 9A shows a semiconductor device 902 that includes a first dielectric layer 904 in which gate structures 906-914 and spacer structures 916-934 are formed. Gate hardmask structures 936-944 are coupled to and positioned above the gate structures 906-914. Each of the gate hardmask structures 936-944 may include a first material having a first etch selectivity. Source/drain structures 946-952 are positioned between the gate structures 906-914. Formation of the source/drain structures 946-952 may be associated with a self-aligned process based on the spacer structures 916-934.

Figure 9B:
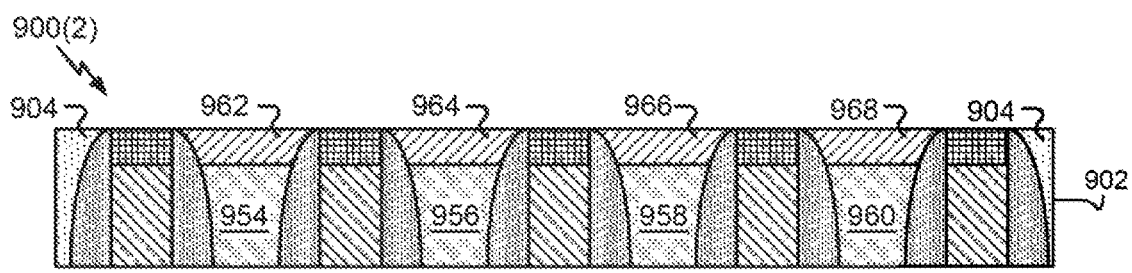

Referring to FIG. 9B, a second stage 900(2) of the fabrication process is depicted. In FIG. 9B, a portion of each of the source/drain structures 946-952 has been etched (e.g., removed using a plasma etch, a dry etch, etc.) to form source/drain structures 954-960 and source/drain hardmask structures 962-968. Each of the source/drain hardmask structures 962-968 may include a second material having a second etch selectivity. The source/drain hardmask structures 962-968 may be deposited using a deposition technique, such as a chemical vapor deposition (CVD) process, an atomic layer deposition (ALD) process, etc., followed by a planarization process, such as a chemical mechanical planarization (CMP) process. The source/drain hardmask structures 962-968 may be confined to a particular corresponding source/drain structure of the source/drain structures 954-960 when the deposition technique is followed by the planarization process.

Figure 9C:
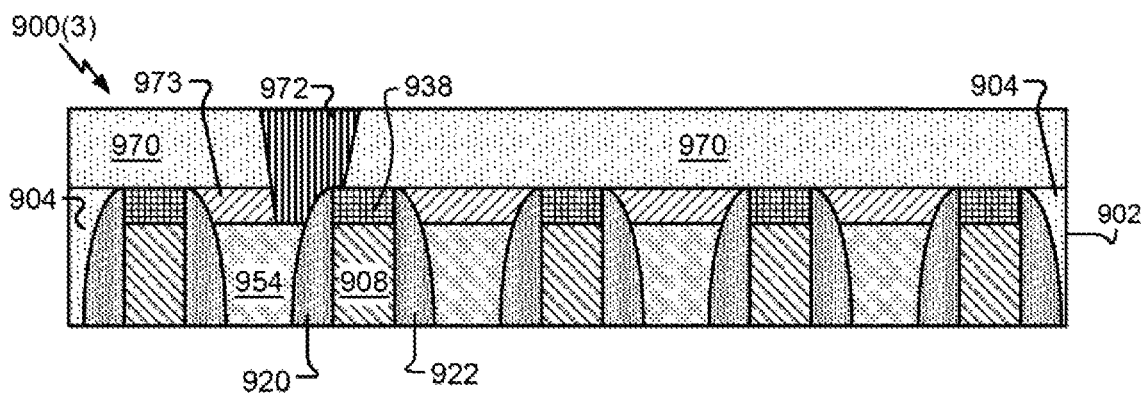

Referring to FIG. 9C, a third stage 900(3) of the fabrication process is depicted. FIG. 9C shows the semiconductor device 902 after formation of a second dielectric layer 970 and formation of a first via structure 972. In some implementations, an etch stop layer (not shown) may be deposited before the second dielectric layer 970 is formed. Formation of the first via structure 972 may include performing a first etching process that is selective to remove the second material (of the source/drain hardmask structures 962-968), but not the first material (of the gate hardmask structures 936-944) or a third material (of the spacer structures 916-934). The first etching process may result in forming a first source/drain hardmask structure 973 by removing a portion of the source/drain hardmask structure 962 of FIG. 9B. After the first etching process is performed, a conductive material (e.g., a metal, such as Copper (Cu)) may be deposited and a planarization process may be performed to form the first via structure 972.

Figure 9D:
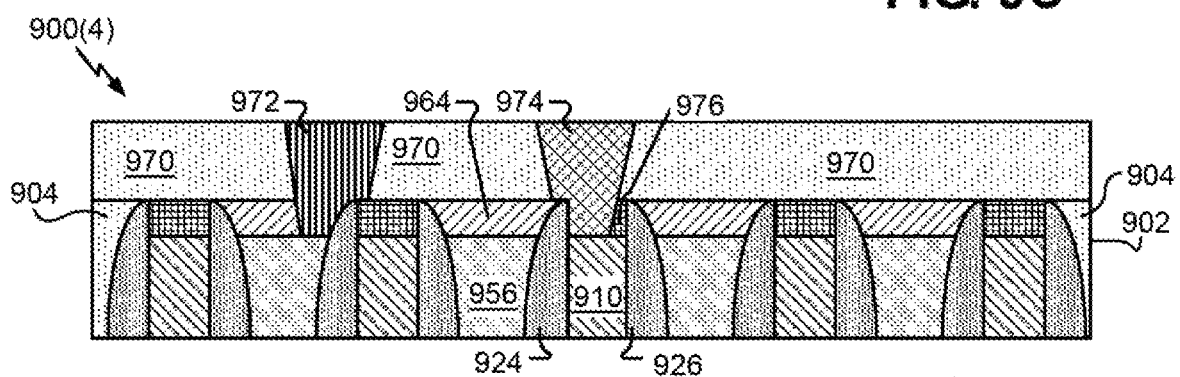

Referring to FIG. 9D, a fourth stage 900(4) of the fabrication process is depicted. FIG. 9D shows the semiconductor device 902 after formation of a second via structure 974. Formation of the second via structure 974 may include performing a second etching process that is selective to remove the first material, but not the second material or the third material. The second etching process may result in forming a third gate hardmask structure 976 by removing a portion of the gate hardmask structure 940 of FIG. 9A. After the second etching process is performed, a conductive material may be deposited and a planarization process may be performed to form the second via structure 974.

Figure 9E:
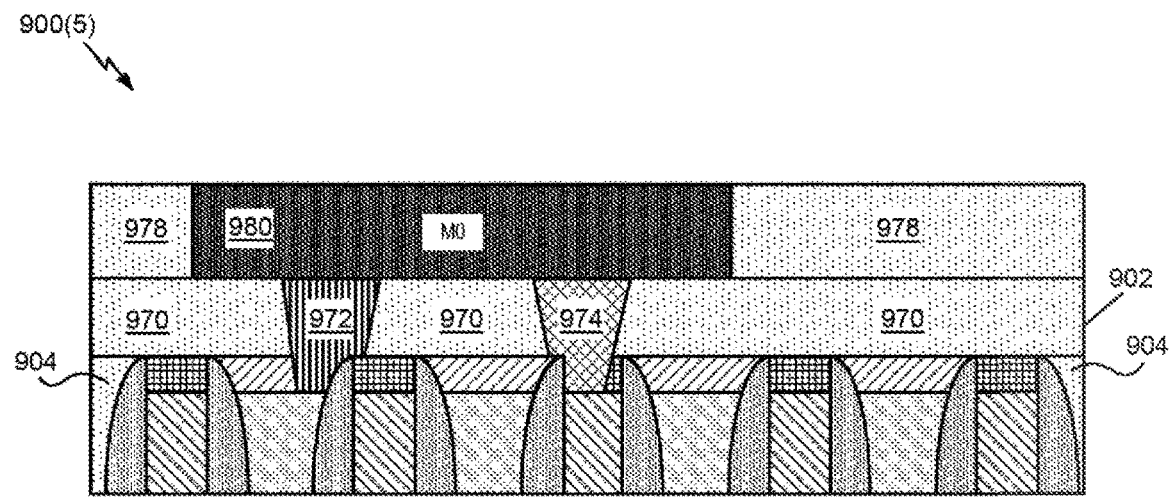

Referring to FIG. 9E, a fifth stage 900(5) of the fabrication process is depicted. FIG. 9E shows the semiconductor device 902 after formation of a third dielectric layer 978 and a first metal line 980 (e.g., a metal zero (0) metal layer).

Figure 9F:
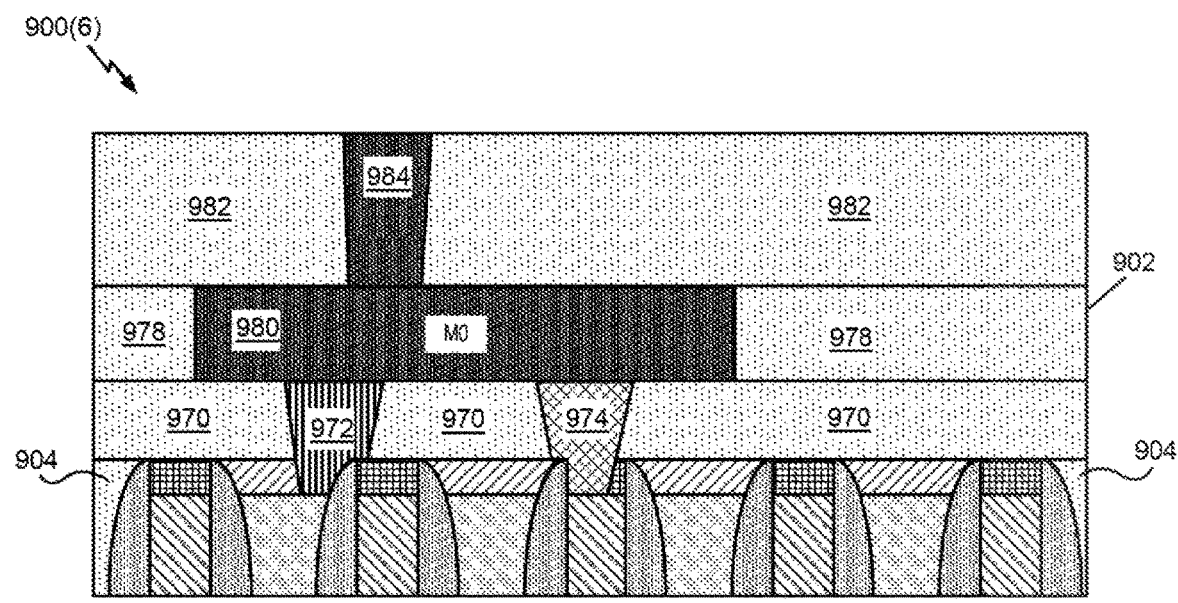

Referring to FIG. 9F, a sixth stage 900(6) of the fabrication process is depicted. FIG. 9F shows the semiconductor device 902 after formation of a fourth dielectric layer 982 and a third via structure 984.

Figure 9G:
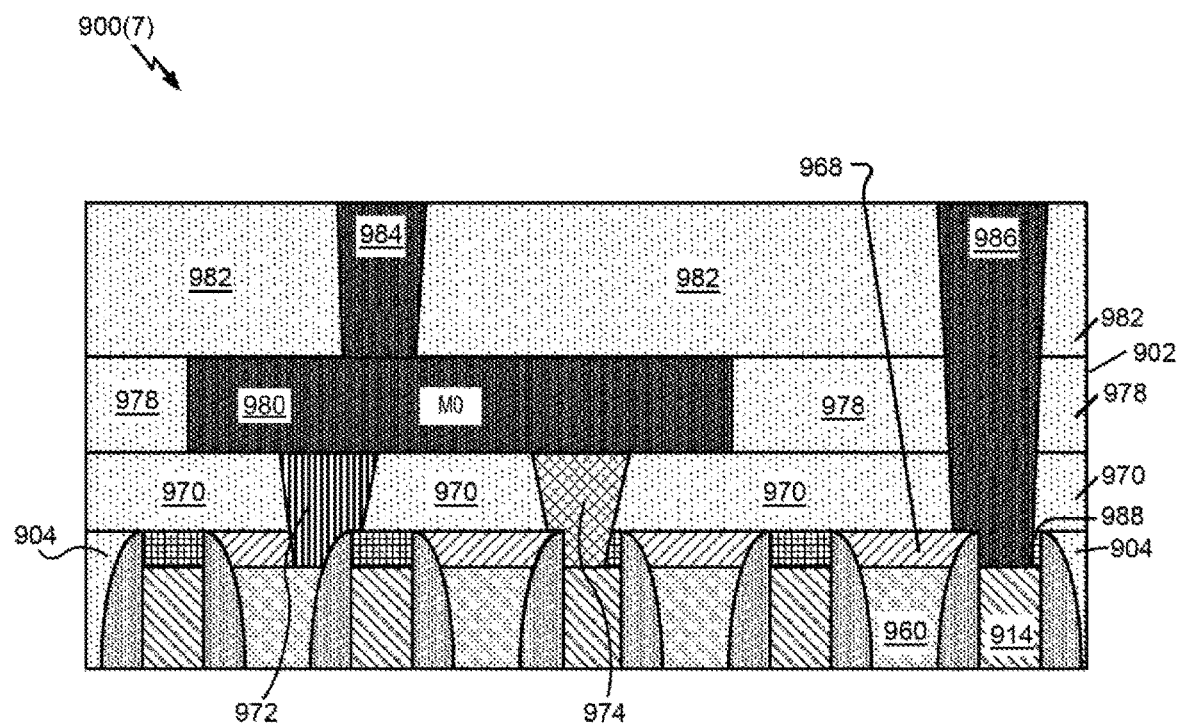

Referring to FIG. 9G, a seventh stage 900(7) of the fabrication process is depicted. FIG. 9G shows the semiconductor device 902 after formation of a fourth via structure 986. Formation of the fourth via structure 986 may include performing a third etching process that is selective to remove the first material but not the second material or the third material. The third etching process may result in forming a fifth gate hardmask structure 988 by removing a portion of the gate hardmask structure 944 of FIG. 9A. After the third etching process is performed, a conductive material may be deposited and a planarization process may be performed to form the fourth via structure 986. In some implementations, the third via structure 984 and the fourth via structure 986 may be formed concurrently. For example, a conductive material may be deposited and the planarization process may form both the third via structure 984 and the fourth via structure 986.

Figure 9H:
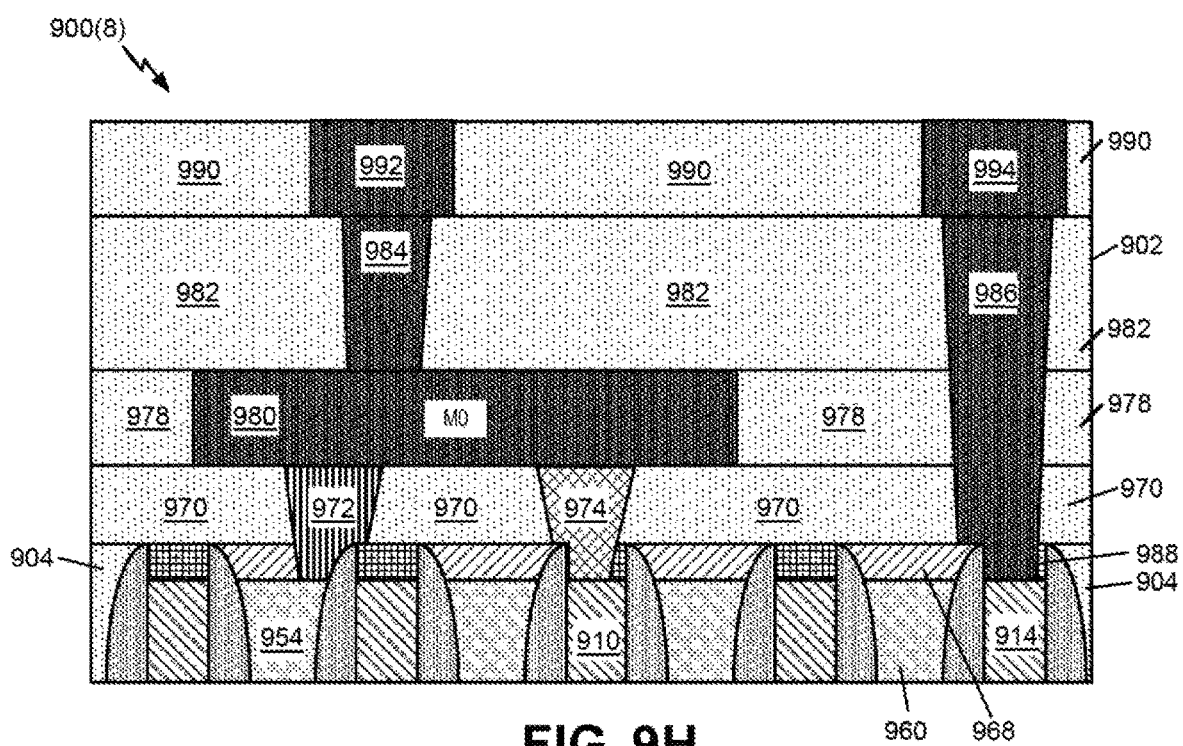

Referring to FIG. 9H, an eighth stage 900(8) of the fabrication process is depicted. FIG. 9H shows the semiconductor device 902 after formation of a fifth dielectric layer 990, a second metal line 992, and a third metal line 994.

Note that the terms first, second, third, and fourth are used with the examples above to describe various elements. Note that the use of these terms is not limiting, but these terms are rather used as labels to uniquely identify elements from each other within a given example to illustrate the example. The terms first, second, third, and fourth can be used interchangeably.

A cell circuit in a semiconductor die with semiconductor devices formed therein that can include a cell circuit in a semiconductor die with semiconductor devices formed therein that include gate contacts (e.g., GCOAs) cross-connected through metal lines routed around offset gate cut areas in a non-active area of the circuit cell, including but not limited to the circuit cell 602 in FIGS. 6 and 7, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
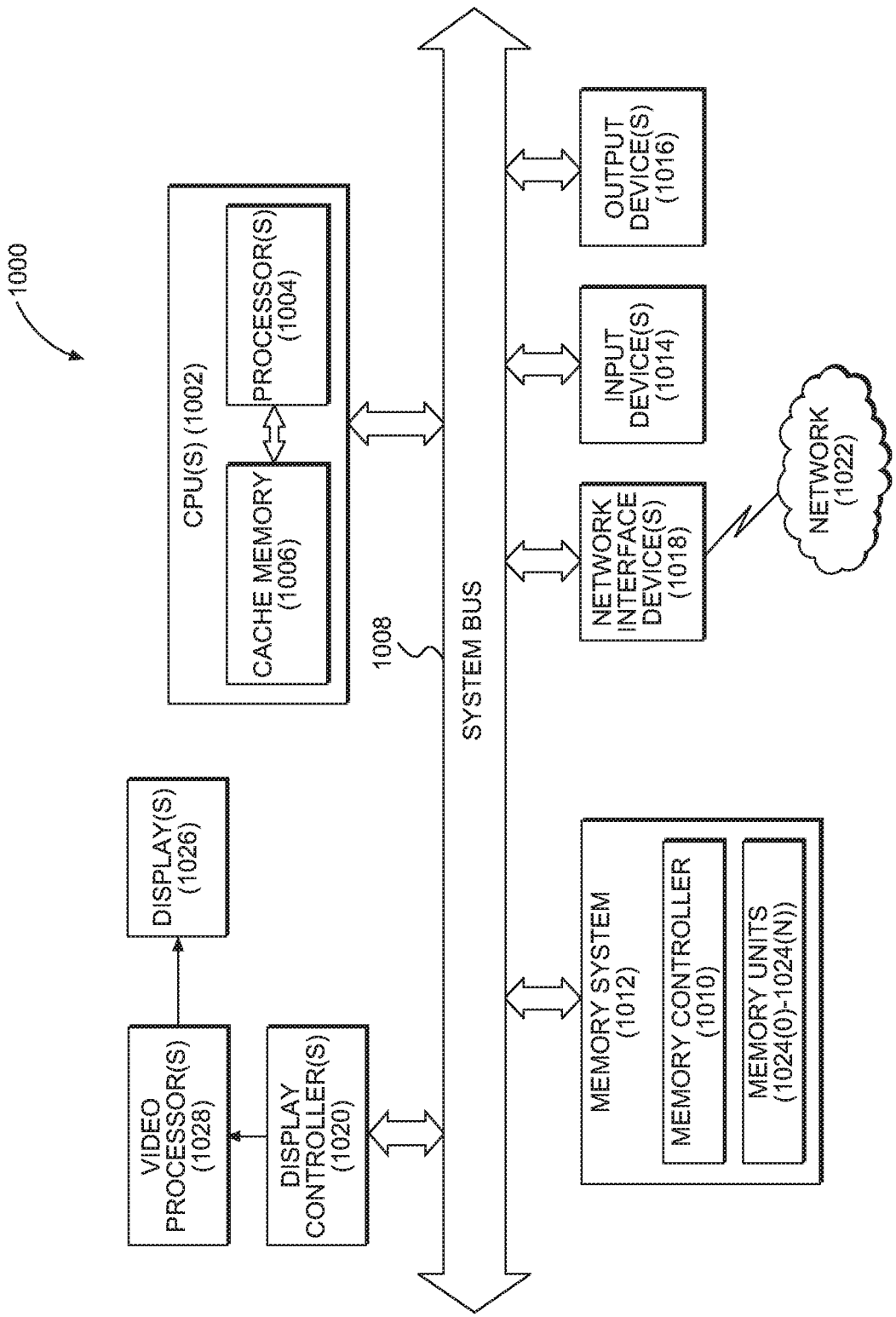
FIG. 10 is a block diagram of an exemplary processor-based system that can include a circuit cell(s) in a semiconductor die with semiconductor devices formed therein that include gate contacts formed over active areas and cross-connected through metal lines routed around offset gate cut areas in a non-active area of the circuit cell, including but not limited to the circuit cell in FIGS. 6 and 7.

In this regard, FIG. 10 illustrates an example of a processor-based system 1000 that can include a cell circuit in a semiconductor die with semiconductor devices formed therein that include gate contacts (e.g., GCOAs) cross-connected through metal lines routed around offset gate cut areas in a non-active area of the circuit cell, including but not limited to the circuit cell 602 in FIGS. 6 and 7. In this example, the processor-based system 1000 includes one or more central processing units (CPUs) 1002, each including one or more processors 1004. As an example, the processors 1004 could include a cell circuit in a semiconductor die with semiconductor devices formed therein that include gate contacts (e.g., GCOAs) cross-connected through metal lines routed around offset gate cut areas in a non-active area of the circuit cell, including but not limited to the circuit cell 602 in FIGS. 6 and 7. The CPU(s) 1002 may have cache memory 1006 coupled to the processor(s) 1004 for rapid access to temporarily stored data. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include a memory system 1012, one or more input devices 1014, one or more output devices 1016, one or more network interface devices 1018, and one or more display controllers 1020, as examples. Each of the one or more input devices 1014, the one or more output devices 1016, the one or more network interface devices 1018, and the one or more display controllers 1020 can include a cell circuit in a semiconductor die with semiconductor devices formed therein that include gate contacts (e.g., GCOAs) cross-connected through metal lines routed around offset gate cut areas in a non-active area of the circuit cell, including but not limited to the circuit cell 602 in FIGS. 6 and 7. The input device(s) 1014 can include any type of input device, including, but not limited to, input keys, switches, voice processors, etc. The output device(s) 1016 can include any type of output device, including, but not limited to, audio, video, other visual indicators, etc. The network interface device(s) 1018 can be any device configured to allow exchange of data to and from a network 1022. The network 1022 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1018 can be configured to support any type of communications protocol desired. The memory system 1012 can include one or more memory units 1024 (0)-1024(N).

The CPU(s) 1002 may also be configured to access the display controller(s) 1020 over the system bus 1008 to control information sent to one or more displays 1026. The display controller(s) 1020 sends information to the display(s) 1026 to be displayed via one or more video processors 1028, which process the information to be displayed into a format suitable for the display(s) 1026. The display(s) 1026 can include any type of display, including, but not limited to, a cathode ray tube (CRT), a liquid crystal display (LCD), a plasma display, a light emitting diode (LED) display, etc.

Figure 11:
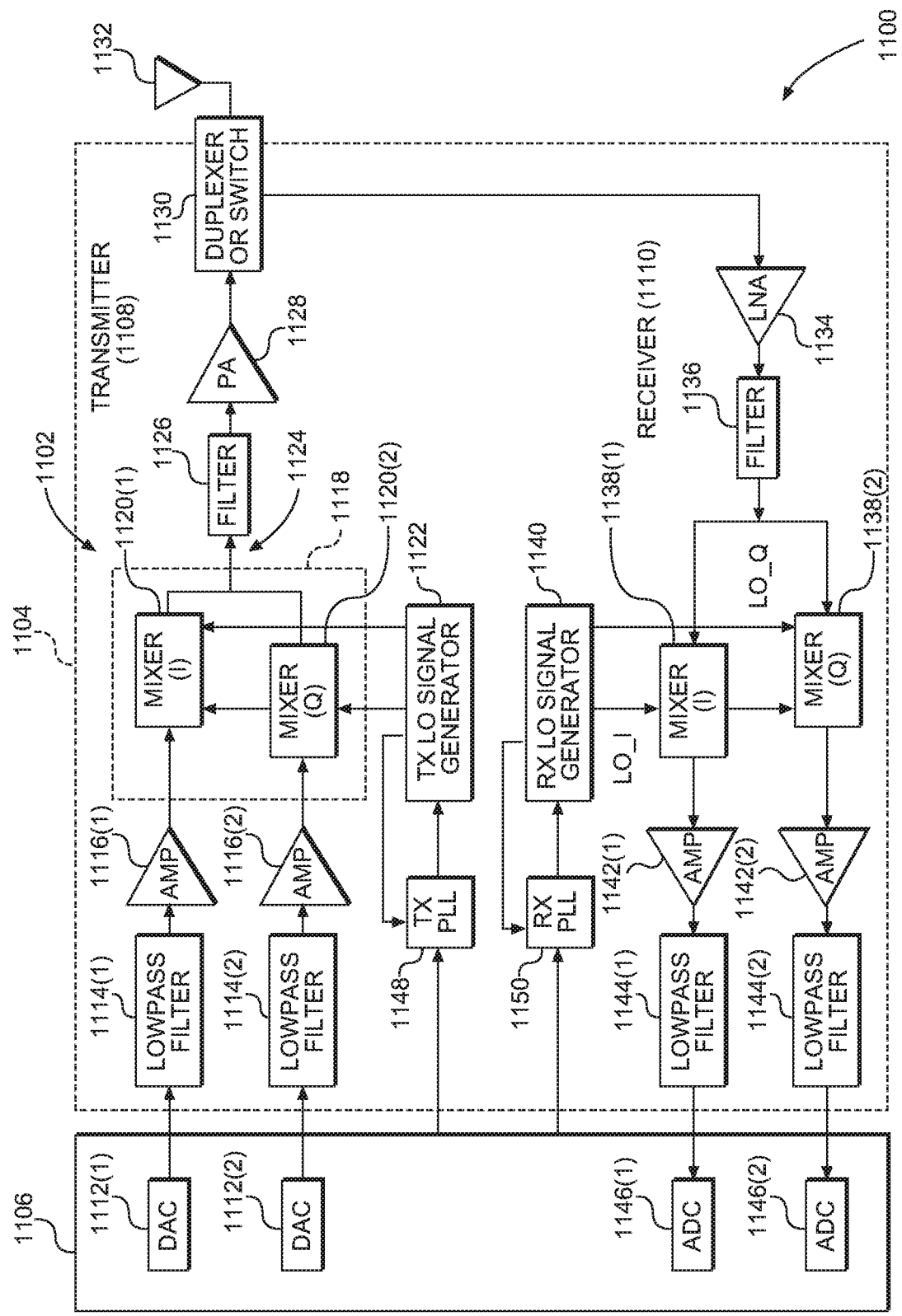
FIG. 11 is a block diagram of an exemplary wireless communications device that includes radio frequency (RF) components formed in an integrated circuit (IC), wherein any of the components therein can include a cell circuit in a semiconductor die with semiconductor devices formed therein that include gate contacts formed over active areas and cross-connected through metal lines routed around offset gate cut areas in a non-active area of the circuit cell, including but not limited to the circuit cell in FIGS. 6 and 7.

FIG. 11 illustrates an exemplary wireless communications device 1100 that includes radio frequency (RF) components formed in an IC 1102, wherein any of the components therein can include a cell circuit in a semiconductor die with semiconductor devices formed therein that include gate contacts (e.g., GCOAs) cross-connected through metal lines routed around offset gate cut areas in a non-active area of the circuit cell, including but not limited to the circuit cell 602 in FIGS. 6 and 7. In this regard, the wireless communications device 1100 may be provided in the IC 1102. The wireless communications device 1100 may include or be provided in any of the above referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1110. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into the I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMP) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals through mixers 1120(1), 1120(2) from a TX LO signal generator 1122 to provide an upconverted signal 1124. A filter 1126 filters the upconverted signal 1124 to remove undesired signals caused by the frequency upconversion as well as noise in a receive frequency band. A power amplifier (PA) 1128 amplifies the upconverted signal 1124 from the filter 1126 to obtain the desired output power level and provides a transmit RF signal. The transmit RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Downconversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by amplifiers (AMP) 1142(1), 1142(2) and further filtered by lowpass filters 1144(1), 1144(2) to obtain I and Q analog input signals, which are provided to the data processor 1106. In this example, the data processor 1106 includes ADCs 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A cell circuit, comprising:
 a P-type diffusion region disposed above a substrate and having a longitudinal axis disposed in a first direction;
 an N-type diffusion region disposed above the substrate and having a longitudinal axis disposed in the first direction;
 a non-diffusion region disposed above the substrate between the P-type diffusion region and the N-type diffusion region;
 a first gate having a longitudinal axis and disposed in a second direction substantially orthogonal to the first direction;
 a second gate having a longitudinal axis substantially parallel to the longitudinal axis of the first gate, the second gate disposed in the second direction substantially orthogonal to the first direction;
 a first metal line in a first metal layer extending in the first direction in a first routing track among a plurality of routing tracks extending in the first direction in the non-diffusion region, the first metal line electrically coupled to the second gate to form a second active gate in the second gate;
a first gate cut area disposed in the first gate, the first gate cut area having a first latitudinal axis in the second direction and disposed in the first routing track adjacent to the first metal line;
a second metal line in the first metal layer extending in the first direction in a second routing track among the plurality of routing tracks in the non-diffusion region, the second metal line electrically coupled to the first gate to form a first active gate in the first gate;
a second gate cut area disposed in the second gate, the second gate cut area having a second latitudinal axis in the second direction substantially parallel to the first latitudinal axis of the first gate cut area and disposed in the second routing track adjacent to the second metal line, the second latitudinal axis of the second gate cut area offset from the first latitudinal axis of the first gate cut area in the second direction; and
a first cross-connect metal line disposed in a second metal layer above the first metal layer and extending in the second direction, the first cross-connect metal line electrically coupled to the first metal line and the second metal line electrically coupling the second active gate to the first active gate.

2. The cell circuit of claim 1, wherein:
the first gate cut area extends into a first routing column among a plurality of routing columns extending in the second direction; and
the second gate cut area extends into a second routing column among the plurality of routing columns, the first routing column and the second routing column do not overlap.

3. The cell circuit of claim 1, wherein:
the first gate cut area does not extend to the second active gate in the first routing track; and
the second gate cut area does not extend to the first active gate in the second routing track.

4. The cell circuit of claim 1, wherein:
the first metal line extends into a first routing column among a plurality of routing columns extending in the second direction;
the second metal line extends into the first routing column; and
the first cross-connect metal line extends into the first routing column.

5. The cell circuit of claim 1, further comprising:
a second gate contact in contact with the second gate, the second gate contact electrically coupling the second gate to the first metal line to form the second active gate; and
a first gate contact in contact with the first gate, the first gate contact electrically coupling the first gate to the second metal line to form the first active gate.

6. The cell circuit of claim 5, wherein:
the second gate contact comprises a first self-aligned gate contact aligned with the first metal line; and
the first gate contact comprises a second self-aligned gate contact aligned with the second metal line.

7. The cell circuit of claim 1, further comprising:
a first semiconductor device comprising the first active gate; and
a second semiconductor device comprising the second active gate.

8. The cell circuit of claim 7, wherein:
the first semiconductor device comprises a P-type metal-oxide semiconductor (MOS) (PMOS) transistor; and
the second semiconductor device comprises an N-type MOS (NMOS) transistor.

9. The cell circuit of claim 1, further comprising:
a third metal line in the first metal layer extending in the first direction in a third routing track among the plurality of routing tracks in the P-type diffusion region, the third metal line electrically coupled to the second gate to form a third active gate in the second gate, the second gate cut area disposed between the second active gate and the third active gate in the second direction;
a fourth metal line in the first metal layer extending in the first direction in a fourth routing track among the plurality of routing tracks in the N-type diffusion region, the fourth metal line electrically coupled to the first gate to form a fourth active gate in the first gate, the first gate cut area disposed between the second active gate and the fourth active gate in the second direction; and
a second cross-connect metal line disposed in the second metal layer and extending in the second direction, the second cross-connect metal line electrically coupled to the third metal line and the fourth metal line electrically coupling the third active gate to the fourth active gate.

10. The cell circuit of claim 9, wherein:
the third metal line extends into a second routing column among a plurality of routing columns extending in the second direction;
the fourth metal line extends into the second routing column; and
the second cross-connect metal line extends into the second routing column.

11. The cell circuit of claim 9, further comprising:
a third gate contact in contact with the second gate, the third gate contact electrically coupling the second gate to the third metal line to form the third active gate; and
a fourth gate contact in contact with the first gate, the fourth gate contact electrically coupling the first gate to the fourth metal line to form the fourth active gate.

12. The cell circuit of claim 11, wherein:
the third gate contact comprises a third self-aligned gate contact aligned with the third metal line; and
the fourth gate contact comprises a fourth self-aligned gate contact aligned with the fourth metal line.

13. The cell circuit of claim 9, further comprising:
a third semiconductor device comprising the third active gate; and
a fourth semiconductor device comprising the fourth active gate.

14. The cell circuit of claim 1, further comprising:
a first voltage rail adjacent to the P-type diffusion region and having a longitudinal axis disposed in the first direction, the first voltage rail disposed in the first metal layer, the first voltage rail configured to receive a first voltage; and
a second voltage rail adjacent to the N-type diffusion region having a longitudinal axis disposed in the first direction, the second voltage rail disposed in the first metal layer, the second voltage rail configured to receive a second voltage;
wherein the plurality of routing tracks are disposed between the first voltage rail and the second voltage rail.

15. The cell circuit of claim 1, wherein the first metal layer comprises a metal zero (M0) metal layer.

16. The cell circuit of claim 15, wherein the second metal layer comprises a metal one (M1) metal layer disposed above the M0 metal layer.

17. The cell circuit of claim 16, wherein the first cross-connect metal line does not extend into a metal layer above the M1 metal layer.

18. The cell circuit of claim 1, wherein the first gate and the second gate are separated by a gate pitch.

19. The cell circuit of claim 1 comprising a standard cell circuit.

20. The cell circuit of claim 1 integrated into an integrated circuit (IC).

21. The cell circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

22. A latch circuit, comprising:
a P-type diffusion region disposed above a substrate and having a longitudinal axis in a first direction;
an N-type diffusion region disposed above the substrate and having a longitudinal axis in the first direction;
a non-diffusion region disposed above the substrate between the P-type diffusion region and the N-type diffusion region;
a first gate having a longitudinal axis and disposed in a second direction substantially orthogonal to the first direction;
a second gate having a longitudinal axis substantially parallel to the longitudinal axis of the first gate, the second gate disposed in the second direction substantially orthogonal to the first direction;
a first P-type metal-oxide semiconductor (MOS) (PMOS) transistor comprising a first PMOS active gate in the first gate, the first PMOS active gate in the non-diffusion region, a first PMOS source/drain in the P-type diffusion region, and a first PMOS drain/source in the P-type diffusion region;
a first N-type MOS (NMOS) transistor comprising a first NMOS active gate in the first gate, the first NMOS active gate in the N-type diffusion region, a first NMOS source/drain in the N-type diffusion region, and a first NMOS drain/source in the N-type diffusion region;
a first gate cut area disposed in the first gate in the non-diffusion region between the first PMOS active gate and the first NMOS active gate and electrically isolating the first PMOS active gate and the first NMOS active gate;
a second PMOS transistor comprising a second PMOS active gate in the second gate, the second PMOS active gate in the P-type diffusion region and electrically coupled to the first NMOS active gate, a second PMOS source/drain in the P-type diffusion region, and a second PMOS drain/source in the P-type diffusion region;
a second NMOS transistor comprising a second NMOS active gate in the second gate, the second NMOS active gate in the non-diffusion region and electrically coupled to the first PMOS active gate, a second NMOS source/drain in the N-type diffusion region, and a second NMOS drain/source in the N-type diffusion region; and
a second gate cut area disposed in the second gate in the non-diffusion region between the second PMOS active gate and the second NMOS active gate and electrically isolating the second PMOS active gate and the second NMOS active gate.

23. The latch circuit of claim 22, further comprising:
a first metal line in a first metal layer extending in the first direction in a first routing track among a plurality of routing tracks extending in the first direction in the non-diffusion region, the first metal line electrically coupled to the first PMOS active gate;
a second metal line in the first metal layer extending in the first direction in a second routing track among the plurality of routing tracks in the non-diffusion region, the second metal line electrically coupled to the second NMOS active gate; and
a first cross-connect metal line disposed in a second metal layer above the first metal layer and extending in the second direction, the first cross-connect metal line electrically coupled to the first metal line and the second metal line electrically coupling the first PMOS active gate to the second NMOS active gate.

24. The latch circuit of claim 23, further comprising:
a third metal line in the first metal layer extending in the first direction in a third routing track among the plurality of routing tracks in the P-type diffusion region, the third metal line electrically coupled to the second PMOS active gate;
a fourth metal line in the first metal layer extending in the first direction in a fourth routing track among the plurality of routing tracks in the N-type diffusion region, the fourth metal line electrically coupled to the first NMOS active gate; and
a second cross-connect metal line disposed in the second metal layer and extending in the second direction, the second cross-connect metal line electrically coupled to the third metal line and the fourth metal line electrically coupling the second PMOS active gate to the first NMOS active gate.

25. The latch circuit of claim 24, wherein:
the first gate cut area has a first latitudinal axis in the second direction and is disposed in the second routing track adjacent to the second metal line; and
the second gate cut area has a second latitudinal axis in the second direction substantially parallel to the first latitudinal axis of the first gate cut area and disposed in the first routing track adjacent to the first metal line, the second latitudinal axis of the second gate cut area offset from the first latitudinal axis of the first gate cut area in the second direction.

26. The latch circuit of claim 25, wherein:
the first PMOS active gate comprises a first PMOS self-aligned gate contact aligned with the first metal line;
the first NMOS active gate comprises a first NMOS self-aligned gate contact aligned with the fourth metal line;
the second PMOS active gate comprises a second PMOS self-aligned gate contact aligned with the third metal line; and the second NMOS active gate comprises a second NMOS self-aligned gate contact aligned with the second metal line.

\* \* \* \* \*